US011008214B2

(12) United States Patent
Bengali et al.

(10) Patent No.: US 11,008,214 B2
(45) Date of Patent: May 18, 2021

(54) SUBSTRATE ASSEMBLY AND RELATED METHODS

(71) Applicant: HEWLETT-PACKARD DEVELOPMENT COMPANY, L.P., Houston, TX (US)

(72) Inventors: Sadiq Bengali, Corvallis, OR (US); Manish Giri, Corvallis, OR (US)

(73) Assignee: Hewlett-Packard Development Company, L.P., Spring, TX (US)

(*) Notice: Subject to any disclaimer, the term of this patent is extended or adjusted under 35 U.S.C. 154(b) by 217 days.

(21) Appl. No.: 16/094,411

(22) PCT Filed: Jul. 22, 2016

(86) PCT No.: PCT/US2016/043704
§ 371 (c)(1),
(2) Date: Oct. 17, 2018

(87) PCT Pub. No.: WO2018/017134
PCT Pub. Date: Jan. 25, 2018

(65) Prior Publication Data
US 2019/0127219 A1 May 2, 2019

(51) Int. Cl.
B81C 1/00 (2006.01)
B01L 3/00 (2006.01)
B81B 1/00 (2006.01)

(52) U.S. Cl.
CPC .... B81C 1/00071 (2013.01); B01L 3/502707 (2013.01); B81B 1/002 (2013.01);
(Continued)

(58) Field of Classification Search
CPC ....... B01L 3/502707; B01L 2300/0645; B81C 1/00119; B81B 2201/05; B81B 2201/058
See application file for complete search history.

(56) References Cited

U.S. PATENT DOCUMENTS 4,990,383 A 2/1991 Bergstrom et al.
6,843,899 B2 1/2005 Ufer
(Continued)

FOREIGN PATENT DOCUMENTS

CN 103649724 A 3/2014
JP H05001669 1/1993
(Continued)

OTHER PUBLICATIONS

Erkal; "3D Printed Microfluidic Devices with Integrated Versatile and Reusable Electrodes"; Lab on a Chip; Apr. 14, 2014; pp. 2023-2032; No. 12.
(Continued)

Primary Examiner — Zandra V Smith
Assistant Examiner — Andre C Stevenson
(74) Attorney, Agent, or Firm — Fabian VanCott

(57) ABSTRACT

Example sensor apparatus for microfluidic devices and related methods are disclosed. In examples disclosed herein, a method of fabricating a sensor apparatus for a microfluidic device includes etching a portion of an intermediate layer to form a sensor chamber in a substrate assembly, where the substrate assembly has a base layer and the intermediate layer, and where the base layer comprises a first material and the intermediate layer comprises a second material different than the first material. The method includes forming a first electrode and a second electrode in the sensor chamber. The method also includes forming a fluidic transport channel in fluid communication with the sensor chamber, where the fluidic transport channel comprises a third material different than the first material and the second material.

19 Claims, 12 Drawing Sheets

(52) U.S. Cl.
CPC ... *B81C 1/00119* (2013.01); *B01L 2300/0645* (2013.01); *B01L 2300/0887* (2013.01); *B81B 2201/05* (2013.01); *B81B 2201/058* (2013.01); *B81B 2203/0338* (2013.01); *B81B 2203/04* (2013.01); *B81C 2201/014* (2013.01); *B81C 2201/016* (2013.01)

(56) References Cited

U.S. PATENT DOCUMENTS

| | | | |
|---|---|---|---|
| 7,863,140 | B2 | 1/2011 | Lim et al. |
| 8,585,910 | B2 | 11/2013 | Sparks et al. |
| 8,702,959 | B2 | 4/2014 | Shacham-Diamand et al. |
| 8,921,952 | B2 | 12/2014 | Dawson et al. |
| 2004/0253123 | A1 | 12/2004 | Xie |
| 2004/0258885 | A1 | 12/2004 | Kreutter et al. |
| 2011/0269632 | A1 | 11/2011 | Haick et al. |
| 2012/0283538 | A1* | 11/2012 | Rose .................. A61B 5/14735 600/347 |
| 2013/0079254 | A1* | 3/2013 | Azimi .................... C12Q 1/68 506/39 |
| 2013/0240359 | A1* | 9/2013 | Turner .................. C12Q 1/6869 204/451 |
| 2013/0334579 | A1* | 12/2013 | Accardi ............... G01N 27/414 257/253 |
| 2014/0299472 | A1 | 10/2014 | Chang et al. |
| 2014/0349867 | A1* | 11/2014 | Handique ............ C12Q 1/6844 506/9 |

FOREIGN PATENT DOCUMENTS

| | | |
|---|---|---|
| JP | 2005334874 | 12/2005 |
| JP | 2006150587 | 6/2006 |
| JP | 2008539090 | 11/2008 |
| JP | 2010514584 | 5/2010 |
| JP | 2011131309 | 7/2011 |
| JP | 2013031919 | 2/2013 |
| JP | 2014146802 | 8/2014 |
| TW | 201425935 A | 7/2014 |
| WO | WO-2014207617 | 7/2013 |

OTHER PUBLICATIONS

Wonjae; "3D-printed Microfluidic Device for the Detection of Pathogenic Bacteria Using Size-based Separation in Helical Channel with Trapezoid Cross-section"; Jan. 12, 2015.

* cited by examiner

SUBSTRATE ASSEMBLY AND RELATED METHODS

BACKGROUND

Microfluidic systems such as, for example, fluid ejection systems (e.g., an ink jet cartridge), microfluidic biochips, etc., often employ microfluidic apparatus (or devices). Microfluidic apparatus may enable manipulation and/or control of small volumes of fluid through microfluidic fluid channels or networks of the microfluidic systems. For example, microfluidic devices may enable manipulation and/or control of volumes of fluid on the order of microliters (i.e., symbolized µl and representing units of $10^{-6}$ liter), nanoliters (i.e., symbolized nl and representing units of $10^{-9}$ liter), or picoliters (i.e., symbolized pl and representing units of $10^{-12}$ liter).

BRIEF DESCRIPTION OF THE DRAWINGS

Where ever possible the same reference numbers will be used throughout the drawing(s) and accompanying written description to refer to the same or like parts.

DETAILED DESCRIPTION

Figure 1:
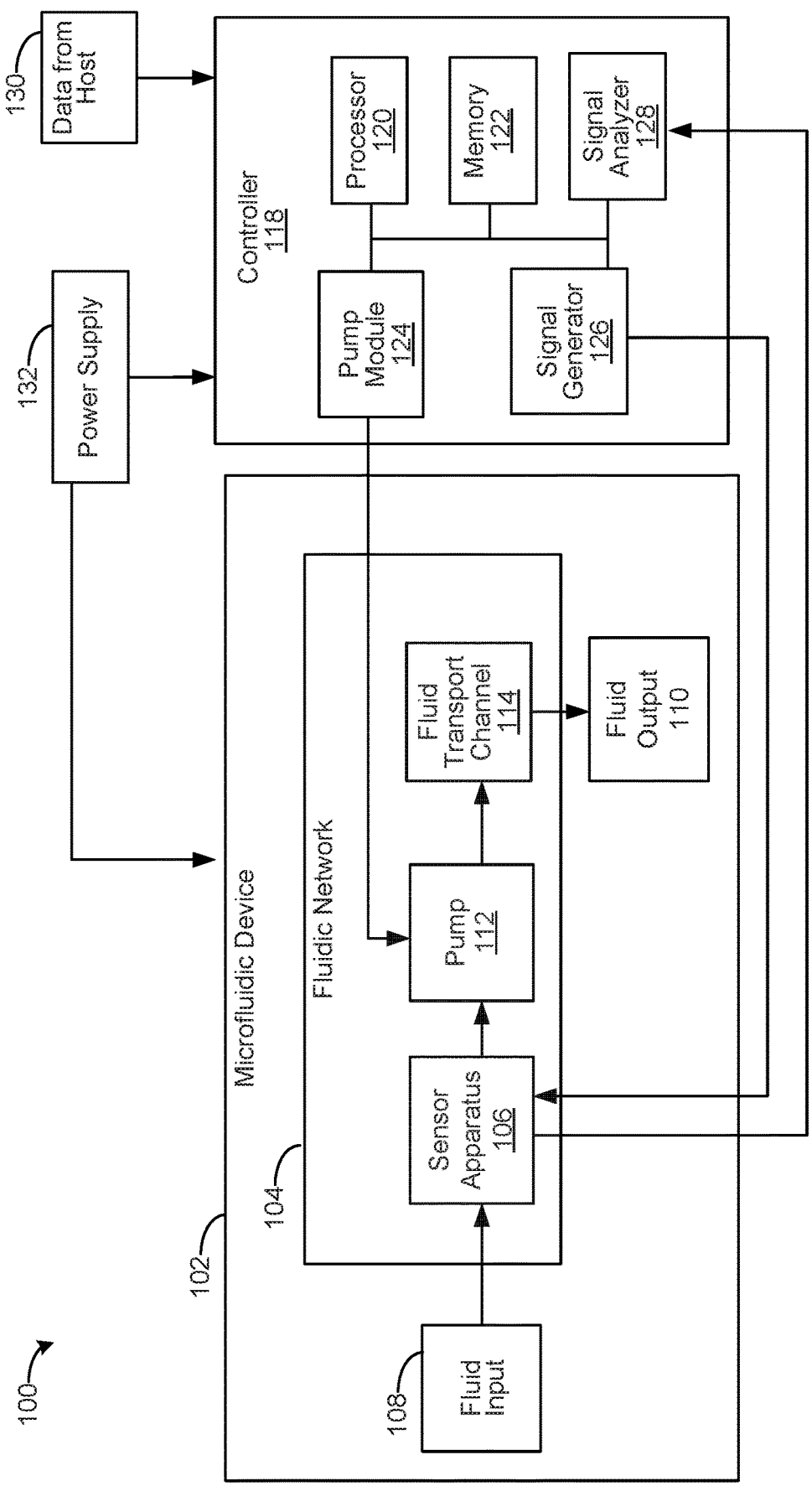
FIG. 1 is a block diagram of an example microfluidic system having an example sensor apparatus constructed in accordance with the teachings disclosed herein.

Certain examples are shown in the above-identified figures and described in detail below. The figures are not to scale and certain features and certain views of the figures may be shown exaggerated in scale or in schematic for clarity and/or conciseness. Additionally, some components of example microfluidic apparatus disclosed herein have been removed from some of the drawing(s) for clarity. Although the following discloses example methods and apparatus, it should be noted that such methods and apparatus are merely illustrative and should not be considered as limiting the scope of this disclosure.

As used herein, directional terms, such as "upper," "lower," "top," "bottom," "front," "back," "leading," "trailing," "left," "right," etc. are used with reference to the orientation of the figures being described. Because components of various examples disclosed herein can be positioned in a number of different orientations, the directional terminology is used for illustrative purposes and is not intended to be limiting.

Microfluidic devices are often employed by microfluidic systems to enable manipulation of fluids (e.g., liquids, bio-fluids, etc.) through a fluid network having fluidic channels with cross-sectional dimensions ranging from a few nanometers to hundreds of micrometers. To determine information about the biological sample, a microfluidic biochip, often referred to as "lab-on-chip" systems, employs microfluidic devices to transport and/or manipulate fluid (e.g., a biological sample) through, for example, a sensor or an analyzer (e.g., a biosensor or bioelectric sensor). For example, microfluidic devices employ a sensor positioned in a network of flow channels that fluidly couple a first portion (e.g., a first reservoir or inlet) of a fluidic network and a second portion (e.g., a second reservoir or outlet) of a fluidic network to analyze a fluid as the fluid flows past the sensor.

In some examples, microfluidic devices employ sensor apparatus (e.g., biosensors, bioelectrical sensors, cell-based sensors, etc.) that provide point of care diagnostics for medical diagnostics, food analysis, environmental monitoring, drug screening and/or other point of care applications. Cell-based sensor apparatus, for example, detect or measure cellular signals from living cells of a sample fluid to identify, for example, a specific species of bacteria, virus and/or disease (e.g., HIV, cancer, etc.). In operation, as the fluid flows adjacent (e.g., past or across) the sensor apparatus (e.g., an electrode), the sensor apparatus detects or converts cellular signals from the cells within the fluid to electrical signals that are analyzed to determine or identify a particular species of bacteria, virus or other disease associated with the cellular signals detected by the sensor (e.g., an electrode). For example, sensor apparatus may employ an electrode positioned in a fluidic channel or a sensor chamber. For example, in operation, an interaction between a cell (e.g., a cell monolayer) in a fluid and a surface of the electrode can be monitored by applying a small amplitude alternate-current (AC) electric field. In some examples, cells, for example, are essentially non-conducting at low frequencies and the cell membrane offers a significant barrier to current flow, which alters the electric field produced by the electrode.

However, detectability of cells in a fluid using a sensor apparatus that employs an electric field is often dependent on dimensional characteristic(s) of the fluidic channel or sensor chamber. For example, the accuracy or sensitivity of the sensor apparatus is dependent on a dimensional footprint or characteristic(s) of the flow channel (e.g., a width, height and/or length of the flow channel). For example, smaller fluidic channels enable enhanced detectability of certain biological fluids having relatively small particles (e.g., sub-micro particles or cells). For example, a first flow channel having a first dimension (e.g., a width) that is smaller than a width of a second flow channel may enable and/or enhance accuracy of detectability of the relatively small particles (e.g., sub-micro particles) compared to the second flow channel having a larger dimension (e.g., a width). For example, a biological fluid having cells associated with a bacteria such as *E. coli* may contain cells having (e.g., diameters) that are less than 5 micrometers. Although a fluidic channel having a width that is greater than 5 micrometers allows the cells to flow past the sensor, a sensitivity of the sensor decreases in larger sized fluidic channels, thereby reducing the accuracy and/or capability of the sensor apparatus detecting cells having sub-micron sizes. For example, a sub-micro particle or cell in a fluid flowing in a larger sized flow channel (e.g., a flow channel having width and/or height greater than 5 micrometers) may have less contact and/or influence on a sensor positioned in the flow channel. In other words, a sub-micro particle (e.g., a smaller sized cells (e.g., 5 micrometers or less)) may not affect (e.g., may not cause a significant, detectable or measurable change or disturbance of) an electric field generated by the sensor apparatus.

On the contrary, a fluid channel having dimensional characteristics less than, for example, 5 micrometers enhances detectability of a sub-micro particle or cell in a fluid. For example, a fluidic channel or sensor chamber having a relatively small dimensional characteristic(s) (e.g., less than 5 micrometers) enhances signal-to-noise ratio of the sensor apparatus, thereby improving the sensitivity, accuracy and/or detectability capability of the sensor apparatus. Thus, controlling a dimensional characteristic(s) of a fluidic channel may significantly enhances accuracy and/or sensitivity of a sensor apparatus.

Conventional microfluidic devices that employ SU-8 material cannot be formed with accurately controlled dimensional characteristic(s) of the fluidic channels or sensor chambers. Thus, accuracy and/or a capability of conventional fluidic devices formed of SU-8 materials or conventional substrate formation process(es) may be limited when detecting certain sub-micro particles or cells in bacteria, virus, disease, etc. For example, to detect or sense sub-micro particles or cells in a biological fluid, conventional microfluidic devices may often employ pre-testing conditioning process(es) such as, for example, lysing and/or DNA amplification techniques. Such pre-testing conditioning technique to prepare the biological sample for testing can be cumbersome, time consuming, expensive and/or may hinder point of care usage of the microfluidic device.

The example methods and apparatus disclosed herein provide a sensor apparatus for microfluidic devices having enhanced and/or enhanced sensitivity and/or detection capability compared to conventional sensors. To provide enhanced detectability and/or sensitivity of a sensor apparatus, the example methods and apparatus disclosed herein employ fabrication technique(s) to accurately control the dimensional characteristic(s) of the fluidic channel and/or sensor chamber. For example, the example methods disclosed herein enable fabrication of sensor apparatus having fluidic channels or sensor chambers formed with micro or nano-dimensional characteristic(s) (e.g., a dimensional width, a dimensional length and/or a dimensional height that are approximately between 2 micrometers and 5 micrometers). For example, the example methods and apparatus disclosed herein enable a three-dimensional sensor apparatus to be located in a sensor chamber having a dimensional width that is approximately between 2 micrometers and 5 micrometers, a dimensional length that is approximately between 5 micrometers and 10 micrometers, and a dimensional depth or height that is approximately between 3 micrometers and 5 micrometers.

In addition, the example sensor apparatus disclosed herein employs electrodes that generate an electric field across a sensor chamber of the sensor apparatus. More specifically, the dimensional characteristics of the sensor chamber disclosed herein enables the electrodes to provide a more uniform electric field across a fluidic channel or sensor chamber through which a fluid passes. To enhance the electric field of the sensor apparatus, the dimensional characteristic(s) enable the electric field to be generated substantially perpendicular relative to a direction of fluid flow through the sensing apparatus.

The example methods disclosed herein enable fabrication and/or accurate control of dimensional characteristic(s) of the sensor apparatus disclosed herein. As used herein, substantially and approximately mean 1% to 10% different than the term at issue. For example, substantially perpendicular means 90 degrees plus or minus 1% to 10%. For example, approximately 10 degrees means 10 degrees plus or minus 1% to 10% (e.g., between 9.9 degrees and 10.1 degrees or between 9 degrees and 11 degrees).

Improving uniformity of an electric field within the sensor apparatus enhances signal-to-noise ratio of the sensor apparatus. As a result of the enhanced signal-to-noise ratio, the sensitivity and/or accuracy of the example sensor apparatus disclosed herein enable detection and/or sensing of sub-micro particles (e.g., cells, virus, bacteria) without involving pre-testing conditioning and/or preparation. In other words, the example sensor apparatus disclosed herein can sense biological fluid having cells that are 5 micrometers or less without requiring lysing, DNA amplification and/or other conditioning technique(s). Thus, the example sensor apparatus disclosed herein enable or enhance point of care usage. In some examples, the dimensional footprint of the sensor apparatus may be employed to provide filtering capability by preventing or restricting passage of particles that are larger (e.g., in diameter) than the dimensional footprint of the sensor apparatus.

Turning more specifically to the illustrated examples, FIG. 1 depicts a microfluidic system 100. The microfluidic system 100 of the illustrated example includes a microfluidic device 102 having a fluidic network 104 that is constructed with an example sensor apparatus 106 in accordance with the teachings of this disclosure. The microfluidic device 102 and/or the microfluidic system 100 of the illustrated example may implement microfluidic systems including assay systems, point of care systems, and/or any systems that involve the use, manipulation, and/or control of small volumes of fluid. For example, the microfluidic device 102 and, more generally the microfluidic system 100 may incorporate components and/or functionality of a room-sized laboratory or system to a small chip such as a microfluidic biochip or "lab-on-chip" that manipulates and/or processes solution based samples and systems by carrying out procedures that may include, for example, mixing, heating, and/or separation. For example, microfluidic biochips can be used to integrate assay operations for analyzing enzymes and DNA, detecting biochemical toxins and pathogens, diagnosing diseases, viruses, bacteria, etc.

The fluidic network 104 of the illustrated example fluidly couples a fluid input 108 and a fluid output 110. The fluidic network 104 of the illustrated example includes the sensor apparatus 106, a pump 112, and a fluid transport channel 114. In particular, the sensor apparatus 106 of the illustrated example is in fluid communication with the fluid output 110 via the fluid transport channel 114. In some examples, the fluid transport channel 114 may employ a plurality of fluidic channels or passages.

To supply fluid or fluidic components, solutions or samples (e.g., biological samples, etc.) to the microfluidic device 102, the microfluidic system 100 of the illustrated example employs the fluid input 108. The fluid input 108 may be a reservoir or cavity to store or hold, for example, a biological fluid sample, and/or any other fluid to be manipulated, moved, separated and/or otherwise processed by the microfluidic system 100. The fluid input 108 of the illustrated example is formed with the microfluidic device 102. In some examples, the fluid input 108 may be a reservoir positioned externally relative to the microfluidic device 102.

The fluid input 108 of the illustrated example is in fluid communication with the sensor apparatus 106 and receives fluid from the fluid input 108. The sensor apparatus 106 of the illustrated example may be an on-chip sensor or analyzer such as, for example, a biosensor or bioelectric sensor, a biochemical sensor, any combination thereof, etc. For example, the sensor apparatus 106 of the illustrated example detects or measures cellular signals from living cells of a sample fluid provided via the fluid input 108 to identify, for example, a specific species of bacteria, virus and/or disease (e.g., HIV, cancer, etc.) associated with the sample fluid. For example, as the fluid flows past or across the sensor apparatus 106, the sensor apparatus 106 of the illustrated example detects or converts cellular signals from cells within the fluid to electrical signals that are analyzed to determine or identify a particular species of bacteria, virus and/or other disease of the sample fluid. The sensor apparatus 106 of the illustrated example employs one or more electrodes positioned in a fluidic channel or a sensor chamber of the fluidic network 104. An interaction between a cell (e.g., a cell monolayer) in a fluid and an surface of the electrode can be monitored by applying a small amplitude alternate-current (AC) electric field. Cells, for example, are essentially non-conducting at low frequencies and the cell membrane offers a significant barrier to current flow, which alters the electric field generated by the electrode of the sensor apparatus 106.

In some examples, the microfluidic device 102 may also include an on chip-device that may include a reactor, a mixer, a thermal detector, a separation chamber, a flow sensor, a nanostructured sensor or biosensors, a metal-oxide-semiconductor field effect transistor (MOSFET), a sensor or biosensor for detecting and/or measuring a concentration of a target molecule, and/or any other on-chip device for analyzing, manipulating and/or preparing the fluid for analysis.

To direct or move fluid from the fluid input 108, to the sensor apparatus 106, and toward the fluid output 110, the fluidic network 104 of the illustrated example includes the pump 112 (e.g., an inertial micro-pump). In some examples, the pump 112 may employ a plurality of pumps to transport and/or carry fluid between the fluid input 108 and the fluid output 110. To move the fluid from the fluid input 108 to the fluid output 110, the pump 112 of the illustrated example creates fluid flow through the fluid transport channel 114. For example, when the pump 112 is activated within the fluid transport channel 114, the pump 112 generates a relatively high pressure (e.g., an inertial bubble-driven pressure). For example, the relatively high pressure may occur (e.g., temporally or for a small duration) during a pump cycle or operation of the pump 112 to induce fluid flow through the fluid transport channel 114. For example, a large amount of fluid mass transport may occur after this relatively high pressure cycle via inertia under relatively small pressure differences that occur as a result of the relatively high pressure. The pump 112 of the illustrated example may positioned and/or formed on a nanometer scale to fit within a flow channel of the fluidic network 104. In some examples, the pump 112 may be a resistor, a bubble generator, a piezoelectric element, an acoustic actuator, a thermal bubble resistor actuator, a piezo membrane actuator, an electrostatic (MEMS) membrane actuator, a mechanical/impact driven membrane actuator, a voice coil actuator, a magnetostrictive drive actuator, a mechanical drive, and/or any other fluid and/or mechanical displacement actuator. In some examples, the microfluidic device 102 may employ external equipment and pump mechanisms, capillary type pumps, electrophoretic pumps, peristaltic and rotary pumps and/or fluid actuators (e.g., bubble generators, piezoelectric elements, thermal resistors, etc.) to manage or promote fluid flow in microfluidic device 102.

To collect the fluid after the fluid has been manipulated by the microfluidic device 102, the microfluidic device 102 of the illustrated example includes the fluid output 110 (e.g., a collector or reservoir). The fluid output 110 of the illustrated example may be reservoir or a cavity that receives the processed fluid. In some examples, the fluid processed by the microfluidic device 102 and captured by the fluid output 110 may be analyzed with, for example, an off-chip optical observation apparatus, an off-chip assay and/or other analysis equipment.

To control fluid flow through the fluidic network 104 and, more generally, to control various components and functions of the microfluidic device 102, the example microfluidic system 100 of the illustrated example employs a controller 118. The controller 118 of the illustrated example includes a processor 120, memory 122, a pump module 124, a signal generator 126, and a signal analyzer 128. The pump module 124 of the illustrated example may enable selective and/or controlled activation of the pump 112. For example, the pump module 124 may determine a sequence, timing, and/or frequency of activating the pump 112 to precisely control fluid flow and/or volume displacements through the fluid transport channel 114 and, more generally through the fluidic network 104. To determine the sequence, timing and/or frequency of activating the pump 112, the pump module 124, the processor 120 and, more generally, the controller 118 of the illustrated example may receive data 130 from a host system, such as a computer. The processor 120, for example, may store the data 130 in the memory 122. The data 130 may be sent to the microfluidic system 100 via communications such as, for example, an electronic, infrared, optical, a wired connection, a wireless connection and/or other communication and/or information transfer path(s). In some examples, the pump module 124 and/or the processor 120 may receive fluid flow information from, for example, a sensor positioned within the fluidic network 104 to determine the sequence, timing and/or frequency for activating the pump 112. The pump module 124, the signal generator 126, the signal analyzer 128 and, more generally, the controller 118 may be electrically coupled to the pump 112 and/or the sensor apparatus 106 via a conductive layer (e.g., a gold layer, a copper layer) and/or leads formed with the microfluidic device 102.

The example signal generator 126 of the illustrated example provides electric current to the sensor apparatus 106. More specifically, the sensor apparatus 106 generates an electric field to analyze the fluid flowing between the fluid input 108 and the fluid output 110 via the fluid transport channel 114. For example, to characterize a sample fluid provided in the fluid input 108, the sensor apparatus 106 of the illustrated example the signal analyzer 128 measures, detects or senses fluctuations, variations and/or changes in an electric field (e.g., perturbations in the electric field or electric potential differences) generated by the sensor apparatus 106 when the fluid (e.g., cells) moves across the sensor apparatus 106. To identify the type of cell (e.g., specie of bacteria, virus, etc.) associated with the fluid, the signal analyzer 128 of the illustrated example may compare (e.g., via comparator) the detected changes in the electric field (e.g., electric field perturbations) with predetermined values obtained from, for example, a look-up table stored in the memory 122. In some examples, information associated with the analyzed fluid (e.g., from the sensor apparatus 106, an off-chip analyzer, etc.) may be transmitted to the controller 118 for further analysis or identification.

The microfluidic system 100 of the illustrated example includes a power supply 132 to provide power to the microfluidic device 102, the controller 118, the sensor apparatus 106, the pump 112, and/or other electrical components that may be part of the microfluidic device 102 and/or the microfluidic system 100. For example, the power supply 132 provides power to the pump 112 to activate or induce fluid flow through the fluid transport channel 114 and the sensor apparatus 106 to generate an electric field.

The structures and components of the fluidic network 104, the controller 118, the microfluidic device 102 and, more generally, the microfluidic system 100 may be fabricated using integrated circuit microfabrication techniques such as thermal inkjet fabrication, electroforming, laser ablation, anisotropic etching, sputtering, dry and wet etching, photolithography, casting, molding, stamping, machining, spin coating, laminating, 3-D printing, and/or any combination thereof and/or any other micro-electrical mechanical system (i.e., MEMS), chip or substrate manufacturing technique(s). In this manner, the fluidic network 104 may include a plurality of sensor apparatus 106, a plurality of fluid transport channels 114 and/or a plurality of pumps 112 on a single chip or substrate. For example, the microfluidic device 102 may include hundreds and/or thousands of fluid transport channels and/or pumps. In some examples, the fluidic network 104 may include a plurality of pumps 112 in fluid communication with the fluid transport channel 114. Additionally, the sensor apparatus 106 and/or the fluidic network 104 may include a channel (e.g., the fluid transport channel 114) that includes a one-dimensional, a two-dimensional and/or a three-dimensional topology.

Figure 2A:
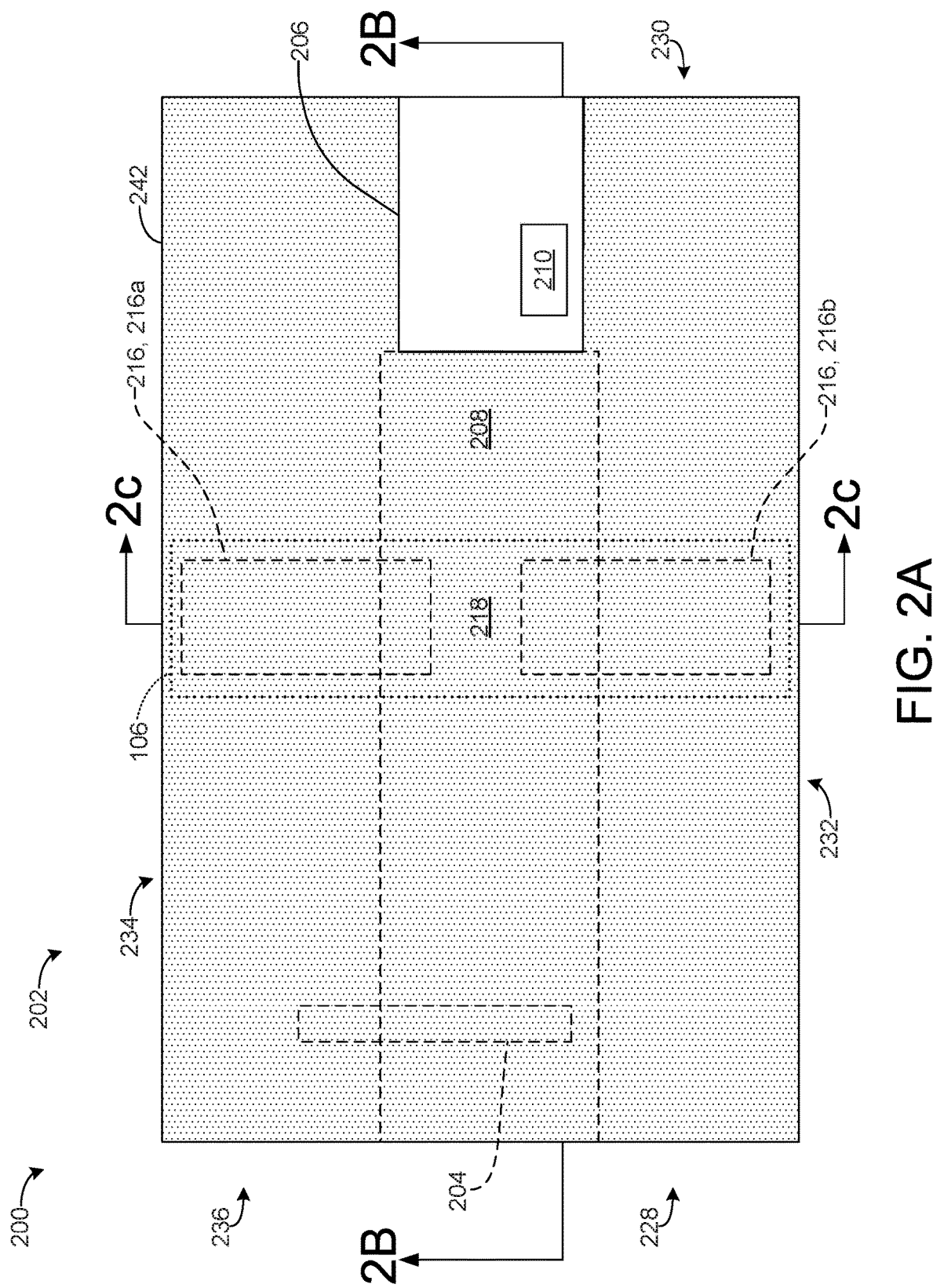
FIG. 2A is a plan view of an example microfluidic device having an example sensor apparatus constructed in accordance with the teachings of this disclosure.
Figure 2B:
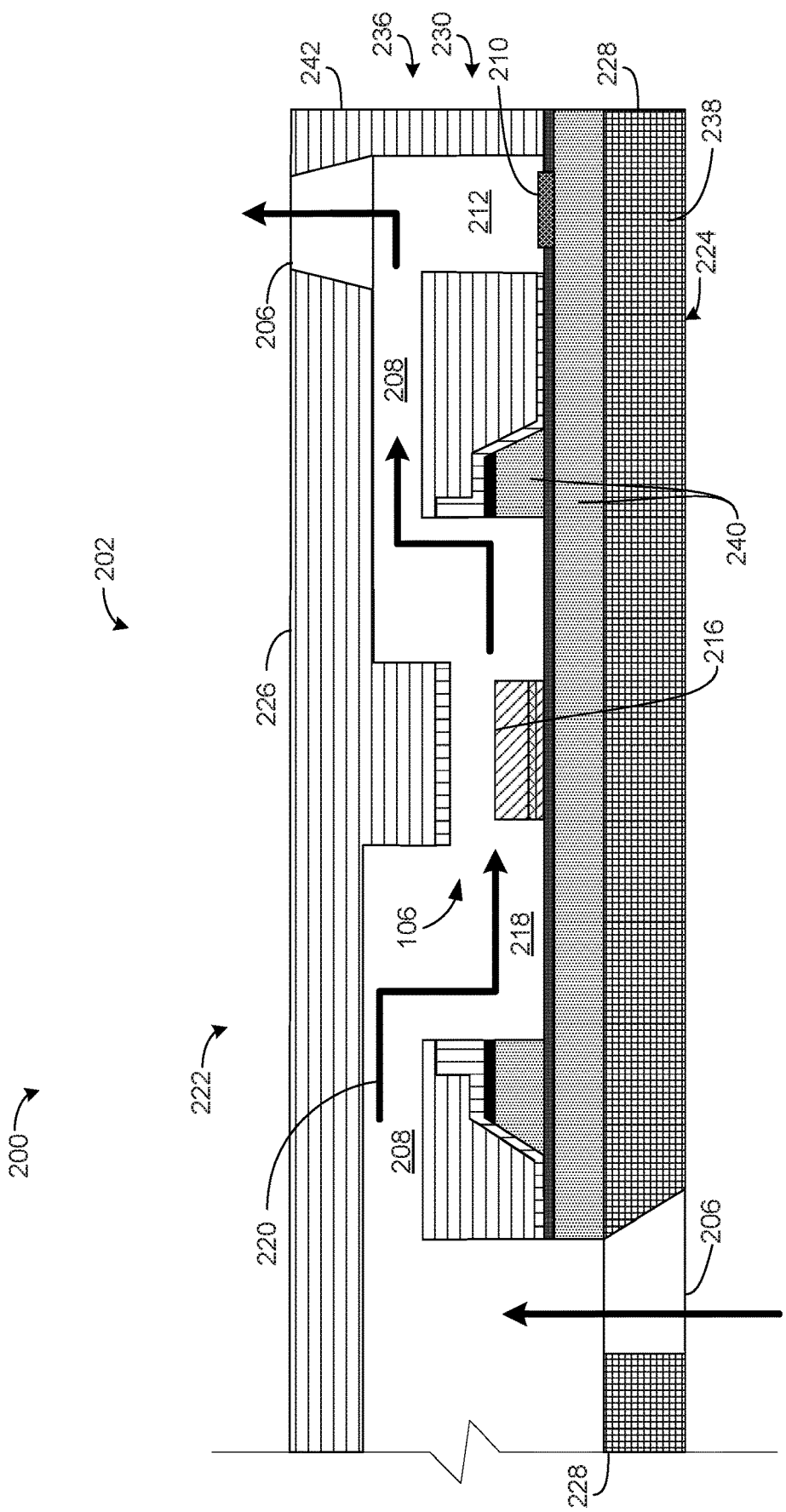
FIG. 2B depicts a cross-sectional view of the example microfluidic device of FIG. 2A taken along line 2B-2B.
Figure 2C:
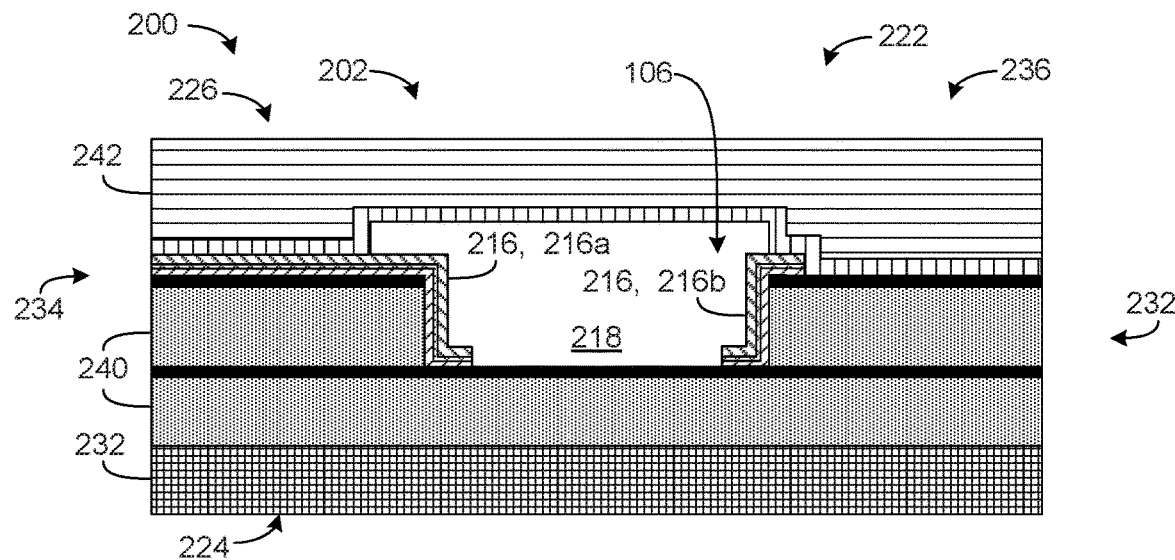
FIG. 2C depicts a cross-sectional view of the example microfluidic device of FIG. 2A taken along line 2C-2C.

FIG. 2A depicts an example microfluidic device 200 including the sensor apparatus 106 that may be used to implement a microfluidic system such as, for example, the microfluidic system 100 of FIG. 1. FIG. 2B is a cross-sectional view of the example microfluidic device 200 of FIG. 2A taken along line 2B-2B. FIG. 2C is a cross-sectional view of the example microfluidic device 200 of FIG. 2A taken along line 2C-2C.

Referring to FIGS. 2A-2C, the microfluidic device 200 of the illustrated example enables manipulation of fluids (e.g., liquids, biological fluid) through a fluidic network 202. For example, the fluidic network 202 may be used to implement the example fluidic network 104 of FIG. 1. To fluidly couple a first portion or a fluid inlet 204 of the fluidic network 202 and a second portion or a fluid outlet 206 of the fluidic network 202, the fluidic network 202 of the illustrated example includes a fluid transport channel 208. In some examples, the first portion and the second portion may be fluid paths or network channels that are in fluid communication with other network channels of the fluidic network 202. In some examples, the first portion and the second portion may be reservoirs, spittoons, cavities, etc. (e.g., to store fluid at ambient pressure). For example, the first portion may be the fluid input 108 of FIG. 1 and second portion may be the fluid output 110 of FIG. 1.

To move or transport fluid through the fluid transport channel 208, the microfluidic device 200 employs a pump 210 (e.g., a fluid actuator, a resistor, etc.). More specifically, the pump 210 of the illustrated example is positioned inside a pump chamber 212 in fluid communication with (e.g., defined by) the fluid transport channel 208 of the microfluidic device 200. To induce fluid flow through the fluid transport channel 208, the pump 210 of the illustrated example is positioned asymmetrically relative to an overall length of the fluid transport channel 208 (e.g., see FIG. 2B). The pump 210 of the illustrated example is formed on a nanometer scale to fit within fluid transport channel 208. The pump 210 of the illustrated example may be a fluid actuator including, for example, a heat generator or a resistor that may be controlled via, for example, the controller 118 of FIG. 1.

To detect or analyze a fluid sample provided at the fluid inlet 204, the example microfluidic device 200 of the illustrated example includes the sensor apparatus 106. The sensor apparatus 106 of the illustrated example is in fluid communication with the fluid transport channel 208 and is positioned between the fluid inlet 204 and the fluid outlet 206. In particular, the sensor apparatus 106 of the illustrated example is positioned upstream from the pump 210. For example, the sensor apparatus 106 defines an on-chip fluid device (e.g., the on-chip sensor) to analyze and/or obtain information relating to the fluid prior to the fluid flowing to the fluid outlet 206.

The sensor apparatus 106 of the illustrated example includes electrodes 216 positioned in a sensor chamber 218. In particular, the electrodes 216 and the sensor chamber 218 are positioned downstream from the fluid inlet 204 and upstream from the pump 210. In operation, for example, a controller (e.g., the controller 118 of FIG. 1) activates the pump 210 to induce fluid flow through the fluid transport channel 208 in a direction 220 from the fluid inlet 204 towards the fluid outlet 206 (e.g., one-directional fluid flow). As the fluid flows through the fluid transport channel 208, the fluid flows in the sensor chamber 218 and across the electrodes 216. To provide a sensing zone while the fluid is in the sensor chamber 218, the electrodes 216 of the illustrated example generate an electric field. In particular, a first electrode 216a receives electric current (e.g., from the signal generator 126 of FIG. 1) and a second electrode 216b provides a signal (e.g., to the signal analyzer 128 of FIG. 1) to detect or measure changes in the electric field when, for example, a fluid flows across the electrodes 216.

The fluidic network 202 of the illustrated example provides a three-dimensional topology (e.g., a three-dimensional fluidic channel). More specifically, the fluidic network 202 of the illustrated example is formed as a body 222 (e.g., a unitary body or a substrate assembly) that spans between a bottom surface 224 and an upper surface 226, a first end 228 and a second end 230 opposite the first end 228, and a first lateral edge 232 and a second lateral edge 234 opposite the first lateral edge 232. For example, the fluid transport channel 208 of the illustrated example begins at the bottom surface 224 of the body 222, travels toward the upper surface 226, extends laterally toward the second end 230, continues in a downward direction toward the bottom surface 224 and the sensor chamber 218, continues upward toward the upper surface 226 and continues laterally toward the second end 230 and to the pump chamber 212. The pump 210 expels the fluid from the pump chamber 212 toward the fluid outlet 206 formed through the upper surface 226 of the body 222.

Referring to FIGS. 2B and 2C, to control the dimensional characteristic(s) (e.g., the dimensional footprint) of the sensor chamber 218 and/or the fluid transport channel 208, the body 222 is formed as a substrate assembly 236. As described in connection with FIGS. 4-18, the substrate assembly 236 of the illustrated example has multiple layers including a base 238, an intermediate portion 240, and an epoxy layer 242. As described in connection with FIGS. 4-18, the fluid inlet 204 is formed in the base 238, the sensor chamber 218 is formed in the intermediate portion 240, and the fluid transport channel 208 is formed in the epoxy layer 242.

Figure 3:
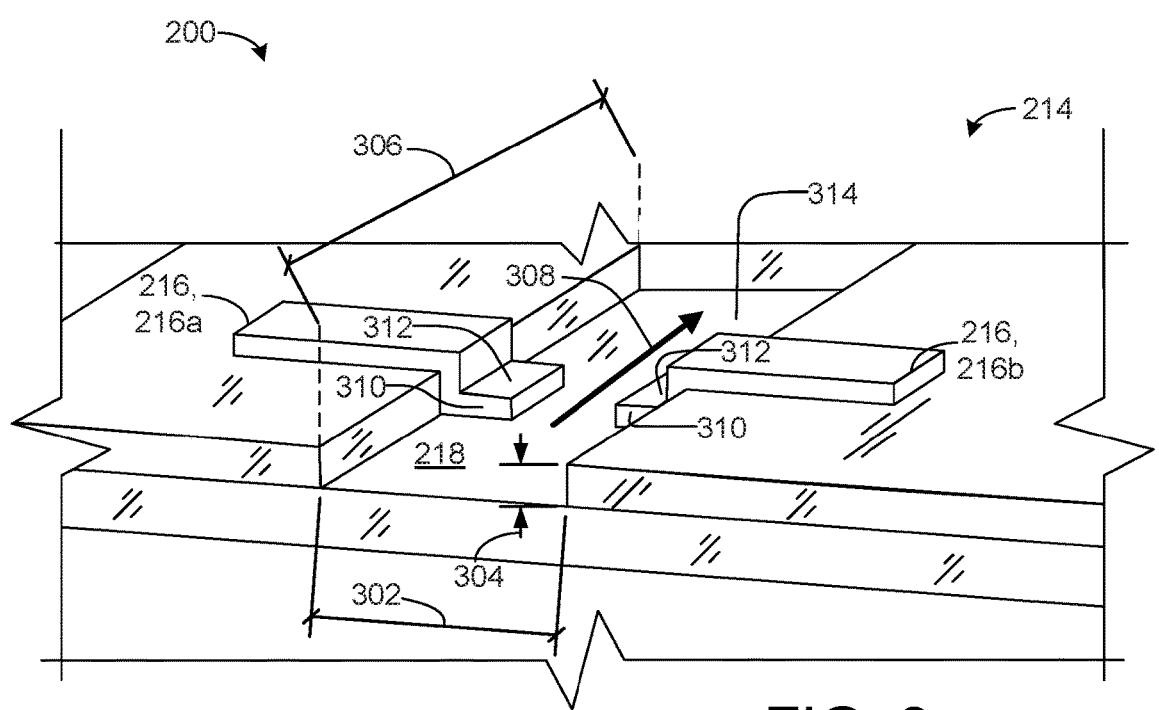
FIG. 3 is a perspective view of the example microfluidic device of FIGS. 2A-2C.

FIG. 3 is a perspective view of the example sensor apparatus 106 of FIGS. 2A-2C. To enhance detectability of nano- or micro-particles, the sensor chamber 218 of the example microfluidic device 200 of FIGS. 2A and 2B may have a dimensional envelope or profile ranging between approximately a few nanometers and approximately hundreds of micrometers. For example, reducing a dimensional footprint of the example sensor chamber 218 allows a greater contact area between a particle and the electrodes 216 than a sensor chamber having a larger dimensional footprint. In other words, the dimensional footprint of the sensor chamber 218 causes greater surface exposure between the electrodes 216 and the nano- or micro-particles of a fluid, which thereby enhances detectability of the electrodes 216. For example, the sensor chamber 218 of the illustrated example may include a first dimensional characteristic 302 (e.g., a dimensional width) of approximately between 2 micrometers and 5 micrometers, a second dimensional characteristic 304 (e.g., a dimensional depth or height) of approximately between 3 micrometers and 5 micrometers, and a third dimensional characteristic 306 (e.g., a dimensional length) of approximately between 5 micrometers and 15 micrometers. In some instances, the dimensional footprint of the sensor chamber 218 provides filtering capability by preventing or restricting passage of particles in a fluid that are larger than the dimensional footprint (e.g., the first dimensional characteristic 302 or the dimensional width) of the sensor chamber 218. In some examples, the first and second dimensional characteristics 302 and/or 304 may be greater than 5 micrometers, and the third dimensional characteristic 306 may be greater than 10 micrometers.

Additionally, the electrodes 216 of the illustrated example are three-dimensional electrodes (e.g., 3-D gold sensors) to enhance detectability of nano- or micro-particles (e.g., cells) in a fluid. For example, each of the electrodes 216 has a portion 310 in the sensor chamber 218 having a dimensional width, a dimensional length, and a dimensional height (e.g., a 3-D sensor). For example, each of the electrodes 216 has an upper surface 312 that is positioned in the sensor chamber 218 and is offset from (e.g., above) a bottom or lower surface 314 of the sensor chamber 218. In particular, the electrodes 216 generate an electric field in the sensor chamber 218 in a direction substantially perpendicular relative to a direction 308 of fluid flow in the sensor chamber 218. In particular, the electrodes 216 of the illustrated example generate a more uniform electric field through the fluid due to, for example, the first dimensional characteristic 302 of the sensor chamber 218, which enhances a signal-to-noise ratio as particles (e.g., cells) in the fluid flows through a sensing zone. In other words, a smaller gap or space of approximately less than 2 micrometers between the electrodes 216 enhances generation and/or perpendicularity of an electric field relative to the direction 308 of fluid flow. As a result, the sensor apparatus 106 enhances accuracy in detecting perturbations in the electric field caused by particles (e.g., sub-micro cells) in the fluid flowing across the electrodes 216. The measured perturbation in the electric field are used to identify a disease, virus, bacteria, etc., associated with the particle or cell that caused the perturbations in the electric field.

Figure 4:
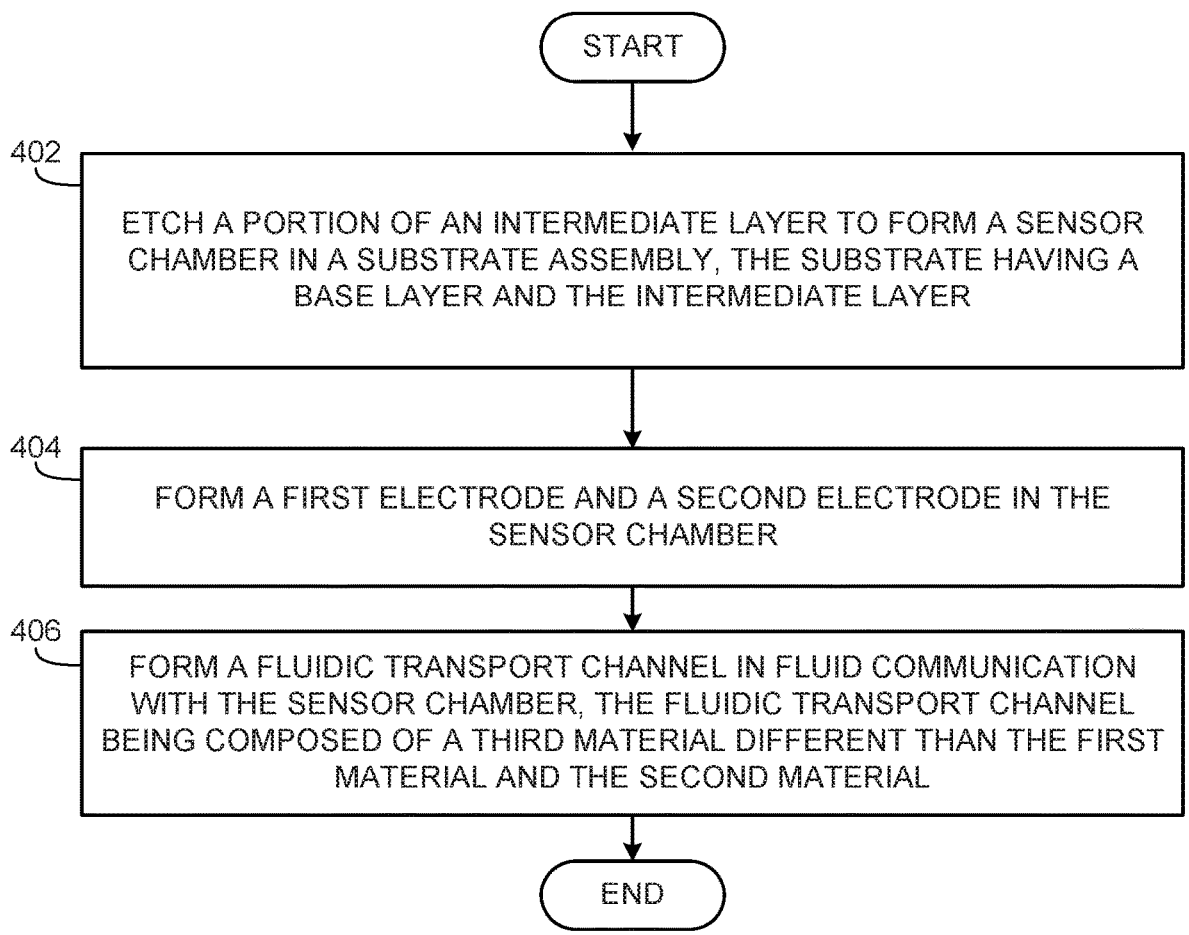
FIG. 4 is a flowchart illustrating an example method of forming an example sensor apparatus disclosed herein.
Figure 5:
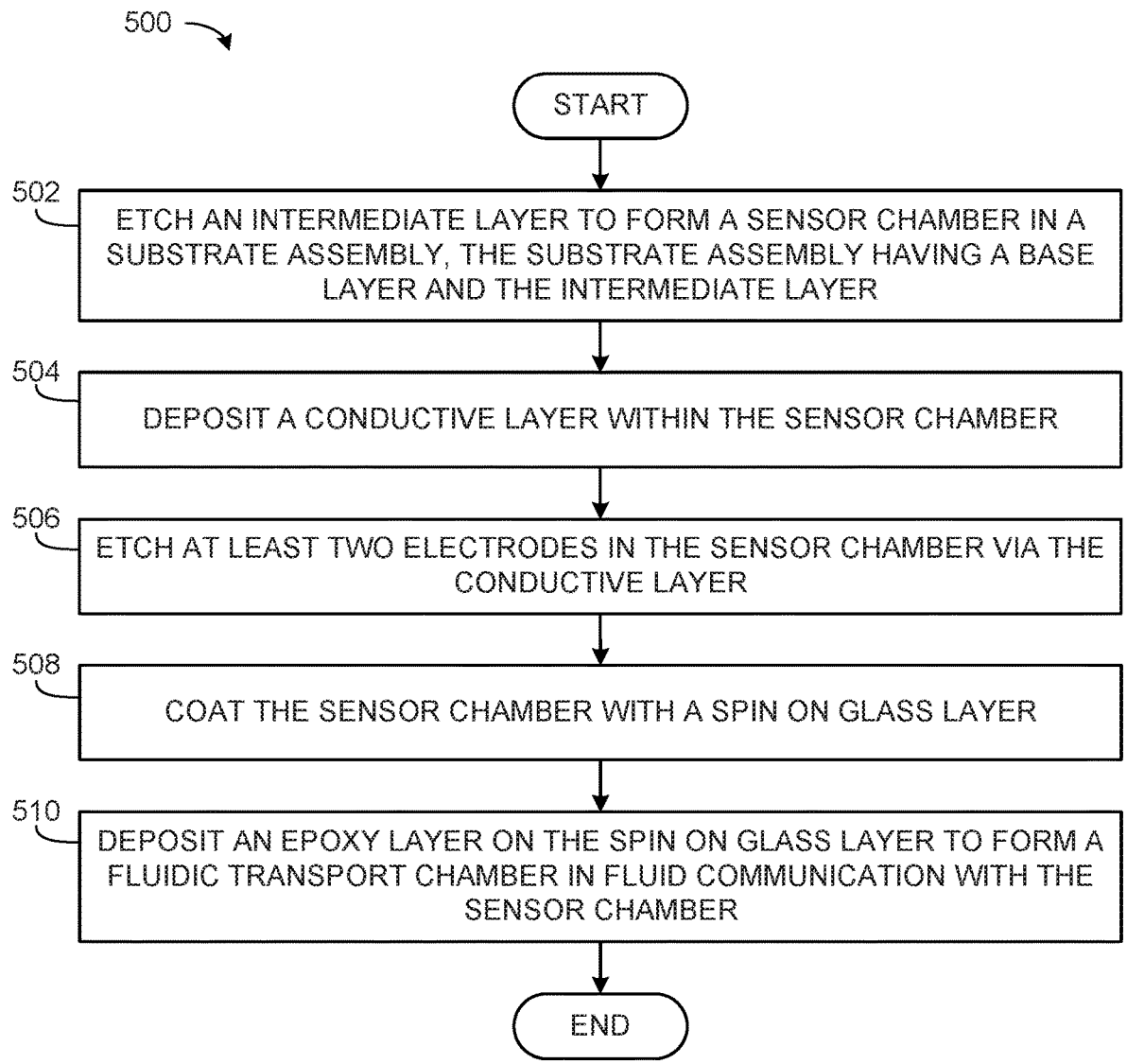
FIG. 5 is another flowchart illustrating an example method of forming an example sensor apparatus disclosed herein.

FIGS. 4 and 5 are a flowcharts of example methods 400 and 500 and FIGS. 6-19 are schematic illustrations of example methods or processes of fabricating an example fluidic channel of a microfluidic network disclosed herein (e.g., the sensor apparatus 106). For example, the example methods of FIGS. 4-19 may be used to fabricate or form the example microfluidic system 100 of FIG. 1 and/or the microfluidic device 200 of FIGS. 2A, 2B and 3. In particular, the methods of FIGS. 4-19 may be used to fabricate or form the sensor apparatus 106 disclosed herein. The illustrated examples of FIGS. 6-19 are cross-sectional views along an orientation similar to line 2C-2C of FIG. 2A.

While an example manner of forming an example sensor apparatus has been illustrated in FIGS. 4-19, one of the steps and/or processes illustrated in FIGS. 4-19 may be combined, divided, re-arranged, omitted, eliminated and/or implemented in any other way. Further still, the example methods of FIGS. 4-19 may include processes and/or steps in addition to, or instead of, those illustrated in FIGS. 4-19, and/or may include more than one of any or all of the illustrated processes and/or steps. Further, although the example methods are described with reference to the flowcharts illustrated in FIGS. 4-19, many other methods or processes of forming a fluidic channel (e.g., the fluidic network 104 of FIG. 1 and/or the fluidic network 202 and/or the sensor chamber 218 of FIGS. 2A-2C) may alternatively be used.

To facilitate discussion of the example methods 400 and 500, the example methods 400 and 500 will be described in connection with the example fluidic device 200 of FIGS. 1, 2A-2C and 3 and the example methods illustrated in FIGS. 6-19.

Referring to the example method 400 of FIG. 4, the method 400 begins by etching a portion of an intermediate layer to form a sensor chamber in a substrate assembly having a base layer and the intermediate layer. (Block 402). In some examples, the base layer may be composed of a first material and the intermediate layer may be composed of a second material different than the first material.

In some examples, the substrate assembly is obtained or provided prior to etching in block 402. In some examples, the substrate assembly is formed via first manufacturing process and the sensor chamber is formed via a second manufacturing process different than the first. In some examples, the substrate assembly is formed concurrently with the formation of the example sensor chamber 218 and/or the example microfluidic device 200 of FIG. 2A-2C. Prior to describing an example of forming the sensor chamber of block 402, an example formation of a substrate assembly is provided below. For example, an example process of forming a substrate assembly is provided in FIG. 6.

Figure 6:
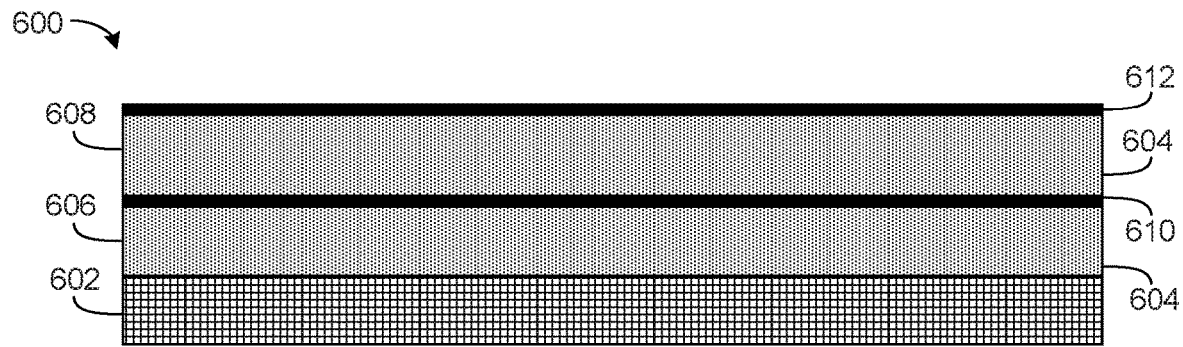
FIGS. 6-19 depict a device at stages of an example method of manufacturing the example sensor apparatus of FIGS. 2A-2C and 3.

For example, referring to FIG. 6, an example substrate assembly 600 may be obtained or formed via microfabrication or MEMS manufacturing process(es) or technique(s) such as, for example, thermal inkjet fabrication process(es) and/or technique(s). The substrate assembly 600 of the illustrated example includes a base layer 602 (e.g., forming the base 238 of FIGS. 2A-2C). The base layer 602 of the illustrated example may be composed of, for example, silicon (Si), gallium arsenide, germanium, quartz, ceramics such as alumina, aluminum, nitride low temperature cofired ceramics (LTCC) and high temperature cofired ceramics (HTCC), metals or glasses, etc. In some examples, the base layer 602 may be a silicon wafer.

To form the sensor chamber 218 of the sensor apparatus 106, the substrate assembly 600 of the illustrated example includes an intermediate layer 604 (e.g., defining the intermediate portion 240 of FIGS. 2A-2C). The intermediate layer 604 of the illustrated example is deposited on the base layer 602. The intermediate layer 604 of the illustrated example is composed of a material that is different than a material of the base layer 602. For example, the intermediate layer 604 of the illustrated example may be composed of tetraethyl orthosilicate (hereinafter referred to as TEOS material), and the base layer 602 may be composed of silicon. The intermediate layer 604 of the illustrated example is composed of a first separation layer 606 (e.g., a first layer of TEOS material) and a second separation layer 608 (e.g., a second layer of TEOS material). In some examples, each of the first separation layer 606 and the second separation layer 608 may have a dimensional thickness of approximately 1.5 micrometers.

In the illustrated example, a passivation layer 610 (e.g., a first ceramic layer) is deposited between the first separation layer 606 and the second separation layer 608. For example, the passivation layer 610 of the illustrated example may be silicon carbide and/or any other suitable ceramic material or other material(s). To provide a stop during an etching process (e.g., wet etching or dry etching), a cap layer 612 (e.g., a second ceramic layer) is deposited on the second separation layer 608 of the illustrated example. The cap layer 612 of the illustrated example may be, for example, silicon carbide, silicon nitride and/or any other suitable ceramic material or other material(s). The cap layer 612 may have a dimensional height of approximately between 500 angstrom and 700 angstrom. The passivation layer 610 and/or the cap layer 612 may be passivation layers of dielectric materials to provide protection against exposure to chemicals and to reduce thermal and mechanical stresses during manufacturing. The passivation layer 610 and/or the cap layer 612 may be provided via, for example, plasma-enhanced chemical vapor deposition (PECVD) to form a film of Silicon Nitride (SiN) followed by a film of Silicon Carbide (SiC). In some examples, the example method 400 of FIG. 4 does not include the passivation layer 410 and/or the cap layer 412.

Referring to FIG. 4, after the substrate assembly 600 is obtained, the sensor chamber 218 is formed (block 402). In some examples, the sensor chamber 218 is patterned to the specific dimensional characteristic(s) 302, 304 and 306 illustrated in FIG. 3. An example process of forming the example sensor chamber 218 is provided in FIGS. 7-9.

Figure 7:
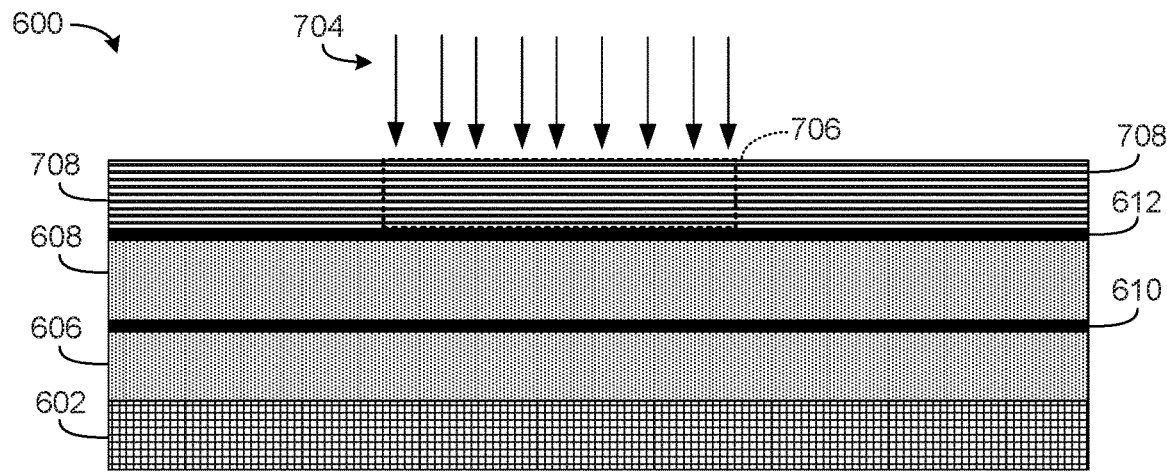

For example, referring to FIG. 7, to provide a mask or a pattern for etching, a photoresist layer 702 is applied (e.g., spun) on the cap layer 612 and/or the second separation layer 608. The photoresist layer 702 may be applied to the cap layer 612 via, for example, example, spin coating, electroplating, spray coating, a laminated dry-film process or patterned plated, etc. The photoresist layer 702 may be any material sensitive to ultra-violet light 704 (wavelengths in the ultraviolet spectrum or shorter (<400 nm)). In some examples, the photoresist layer 702 is a photo-patternable polymer. The photoresist layer 702 may be positive or negative. For positive resists, portions of the resist that are to be removed are exposed to a certain type of light or radiation. In positive resists, the light or radiation changes the chemical structure of the resist so that it becomes more soluble and can be removed. The exposed resist is then washed away via, for example, a solution, leaving only the resist that was not exposed to the light or radiation. Negative resists behave in an opposite manner. Exposure to the light or radiation changes the chemical structure of the resist so that it becomes more difficult to dissolve. In some examples, the photoresist material may include, for example, materials which are capable of chemical structural change in the presence of visible light, x-rays, ultraviolet light, direct write e-beam exposure or other forms of radiation. Some example photoresist material(s) may include polymethylmethacrylate (PMMA), Polyimide, SU8, etc.

In the illustrated example of FIG. 7, the photoresist layer 702 is a positive resist. After the photoresist layer 702 is deposited on the cap layer 712, a portion 706 of the photoresist layer 702 representative of the dimensional characteristics (e.g., the dimensional characteristics 302, 304 and 306) of the sensor chamber 218 is exposed to the light 704, while a portion 708 of the photoresist layer 702 is not exposed to the light 704. Thus, the photoresist layer 702 representative of a dimensional characteristic(s) of the sensor chamber 218 is masked prior to etching the intermediate layer 604.

Figure 8:
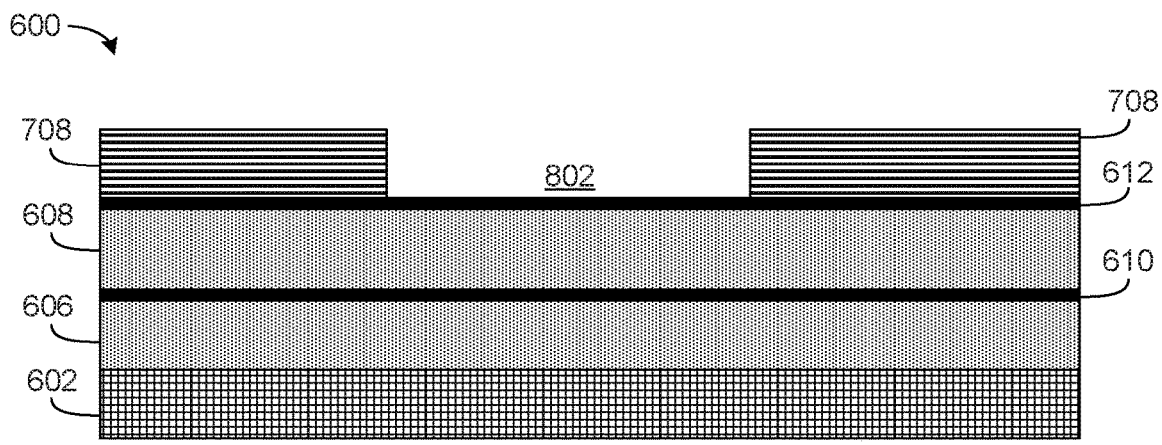

Referring to FIG. 8, the portion 706 of the photoresist layer 702 exposed to the light 704 is removed to form a pattern or area 802 representative of the dimensional characteristics of the sensor chamber 218. For example, the portion 706 of the photoresist layer 702 representative of the dimensional characteristics of the sensor chamber 218 is removed to provide an exposed surface or area 802 of the cap layer 612 and the second separation layer 608. The non-exposed portion 708 of the photoresist layer 702 remains deposited on the cap layer 612 and/or the second separation layer 608.

Figure 9:
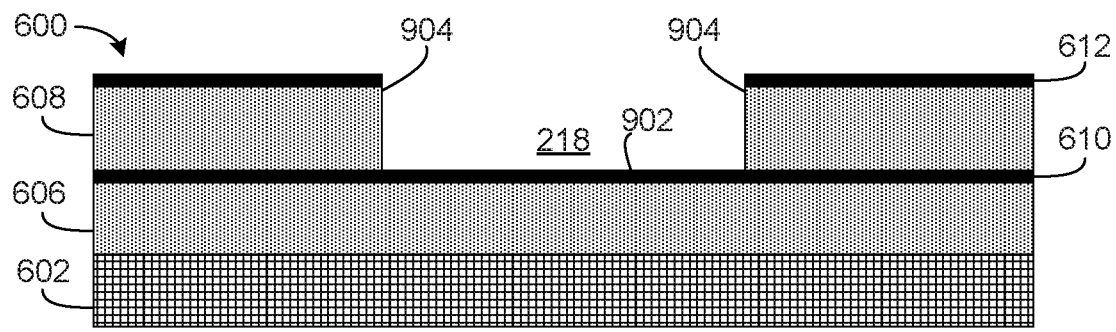

FIG. 9 illustrates the sensor chamber 218 formed in the second separation layer 608. To define the sensor chamber 218, the exposed area 802 of the cap layer 612 and the second separation layer 608 is etched away to a desired depth (e.g., the dimensional characteristic 304 of FIG. 3) and/or until the passivation layer 610, which provides a etch stop. To remove material defined by the exposed area 802, a wet etching process or a dry etching process may be employed. For example, the cap layer 612 and the second separation layer 608 defined by the exposed area 802 may be removed via a wet etching process(es) using, for example, iron chloride, cupric chloride or an alkaline ammonia. Alternatively, the cap layer 612 and the second separation layer 608 defined by the exposed area 802 may be removed using dry etching process(es) using, for example, a plasma of reactive gases such as fluorocarbons, oxygen, chlorine, boron trichloride, with the addition of nitrogen, argon, helium and/or other gases that removes portions of the cap layer 612 and the second separation layer 608 defined by the exposed area 802.

During etching, a liquid ("wet") or plasma ("dry") chemical agent removes the uppermost layer of the substrate assembly 600 in the areas that are not protected by photoresist layer 702. Thus, the non-exposed portion 708 of the photoresist layer 702 protects the cap layer 612 and/or the second separation layer 608 positioned underneath the non-exposed portion 708 during the etching process. After etching is complete, the photoresist layer 702 is then removed from the substrate assembly 600. In some examples, the photoresist material is removed via a plasma containing oxygen to oxidize ("ash") photoresist and facilitate its removal.

The sensor chamber 218 of the illustrated example includes a depth of approximately between 3 micrometers and 5 micrometers (e.g., the dimensional characteristic 304 of FIG. 3). The depth of the sensor chamber 218 may be controlled using, for example, etching time and an etch rate of an etchant (e.g., an etching material such as Potassium hydroxide (KOH)) and a material being etched (e.g., the material of the second separation layer 608 such as TEOS). Thus, the dimensional characteristics 302, 304 and 306 of the sensor chamber 218 of the illustrated example are accurately controlled during fabrication.

In the illustrated example, a bottom surface 902 (e.g., a horizontal surface in the orientation of FIG. 9) of the sensor chamber 218 is defined by the first separation layer 606 and/or the passivation layer 610 and side walls 904 (e.g., substantially vertical walls in the orientation of FIG. 9) of the sensor chamber 218 are defined by the second separation layer 608 and/or the cap layer 612. In some examples, the passivation layer 410 defines the bottom surface 902 of the sensor chamber 218. For example, during etching process, the passivation layer 410 may provide an etch stop to prevent etching through past the passivation layer 410.

The side walls 904 of the sensor chamber 218 of the illustrated example are substantially vertical (e.g., having a slight slope approximately between, for example 0.1 and 2 degrees relative to vertical), and the bottom surface 902 of the illustrated example is substantially horizontal relative to normal (e.g., having a slight slope of approximately between 0.1 and 2 degrees). For example, the sensor chamber 218 of the illustrated example has a rectangular cross-section.

Referring to FIG. 4, the method 400 of FIG. 4 continues with the formation of the electrodes 216 (e.g., first electrode 216a and the second electrode 216b) in the sensor chamber 218 (block 404). An example process of forming the electrodes 216 is illustrated in FIGS. 10-13.

Figure 10:
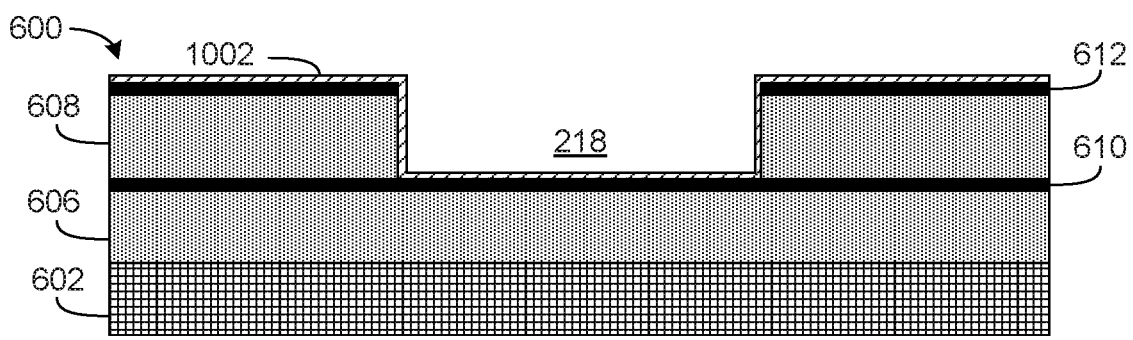

Referring to FIG. 10, in some examples, to protect the sensor chamber 218 from agent(s) or material(s), an atomic layer deposition 1002 (hereinafter ALD layer) is applied to the side walls 904 and the bottom surface 902 of the sensor chamber 218. For example, the ALD layer 1002 protects the sensor chamber 218 against agents or material(s) (e.g., hydrofluoric acid) used during, for example, wet etching process(es) (e.g., a lateral hydrofluoric acid wet etch process) for removal of a spin on glass layer 1402 (hereinafter SOG layer) described in connection with FIGS. 14-19. The ALD layer 1002 is deposited on the second separation layer 608, the side walls 904 of the sensor chamber 218 and the bottom surface 902 of the sensor chamber 218. The ALD layer 1002 may be any hydrofluoric acid resistant material(s) such as, for example, HfO2. In some examples, the ALD layer 1002 may not be provided.

Figure 11:
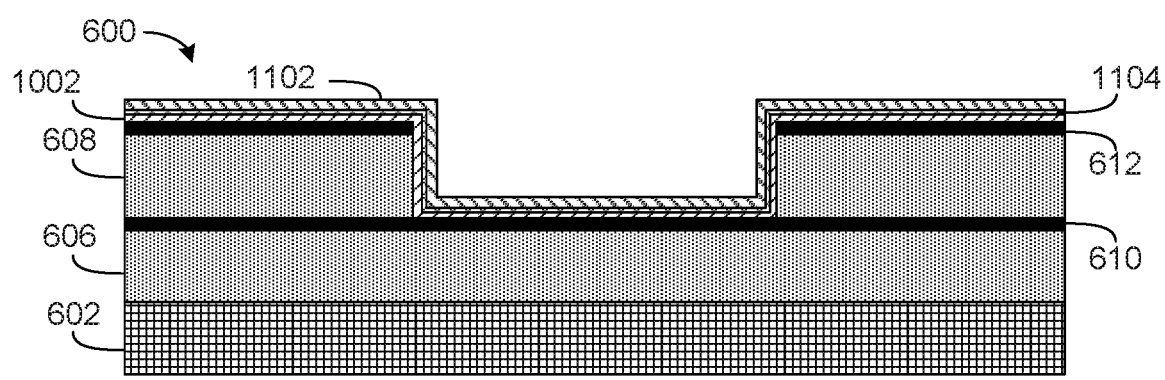

Referring to FIG. 11, to facilitate bonding between an electrically conductive layer 1102 (e.g., a metal) and the ALD layer 1002, a bonding layer 1104 is deposited over the ALD layer 1002. The bonding layer 1104 may be, for example, titanium, chromium and/or any other material to facilitate adhesion of between the conductive layer 1102 and the ALD layer 1002. The bonding layer 1104 may have a height of approximately between 1000 angstrom and 1500 angstrom.

The conductive layer 1102 of the illustrated example is deposited over the bonding layer 1104 after the bonding layer 1104 is deposited on the ALD layer 1002. In particular, the conductive layer 1102 of the illustrated example defines the electrodes 216 of the example sensor apparatus 106 of FIGS. 2A, 2B and 3. The conductive layer 1102 of the illustrated example is gold. However, in some examples, the conductive layer 1102 may be copper, titanium, platinum, silver, and/or any other metal or material having electrically conductive properties or characteristic(s). The conductive layer 1102 of the illustrated example has a thickness of approximately between 2000 angstrom and 3000 angstrom.

Figure 12:
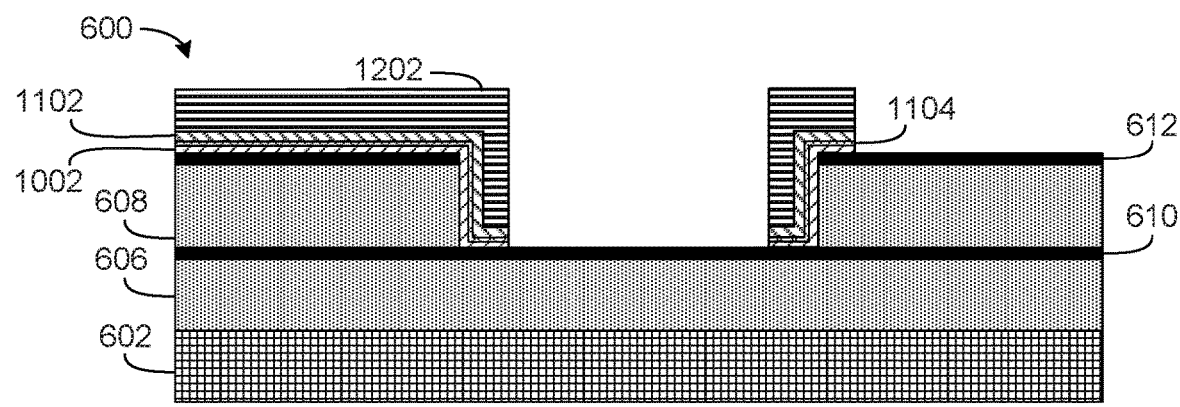

Referring to FIG. 12, to provide a mask or pattern for the first electrode 216a and the second electrode 216b, a photoresist layer 1202 is spun on the conductive layer 1102. For example, to form the electrodes 216 of the sensor apparatus 106, the photoresist layer 1202 is spun on the conductive layer 1102 and masked or patterned over the conductive layer 1102 (e.g., using a UV light). The exposed surfaces of the conductive layer 1102 and/or the bonding layer 1104 not covered with the photoresist layer 1202 is removed via etching (e.g., a wet etch process) to form the electrodes 216 from the conductive layer 1102. In some examples, the bonding layer 1104 is titanium and the conductive layer 1102 is gold. In some such examples, the gold layer may be wet etched with, for example, KOH for approximately between 30 seconds and 45 seconds and the titanium layer may be etched for approximately between 5 minutes and 6 minutes. In some examples, after the first electrode 216a and the second electrode 216b is patterned or masked with the photoresist layer 1202, the conductive layer 1102, the bonding layer 2204 and/or the ALD layer 1002 not protected or covered by the photoresist layer 1202 is etched.

Figure 13:
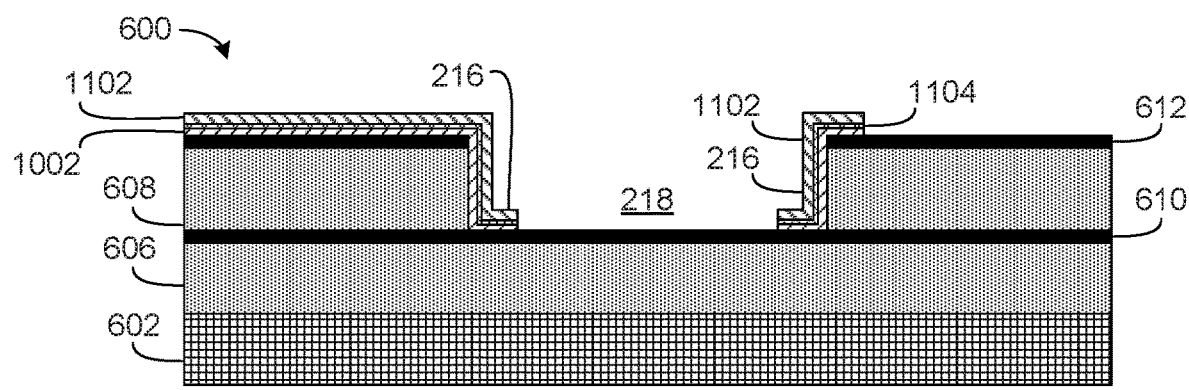

Referring to FIG. 13, after the conductive layer 1102 and/or the bonding layer 1104 are etched and remaining portions of the conductive layer 1102 form the electrodes 216, the photoresist layer 1202 is removed from the conductive layer 1102 as shown in FIG. 13. As shown in FIG. 13, the conductive layer 1102 provides a hard mask to the portions of the bonding layer 1104 covered via the conductive layer 1102 to prevent etching of the bonding layer 1104 positioned underneath the portions of the conductive layer 1102 that is protected by the photoresist layer 1202.

Referring to the method 400 of FIG. 4, the fluid transport channel 208 is formed in fluid communication with the sensor chamber 218 (block 406). An example process of forming the fluidic transport channel 208 is illustrated in FIGS. 14-19. To form the fluid transport channel 208, additional layers are provided to build the substrate assembly 600. For example, the fluid transport channel 208 is composed of a third material (e.g., epoxy, SU8) different than the first material of the base layer 402 and the second material of the intermediate layer 404. To support the additional layers, the substrate assembly 600 may be coated with a support material.

Figure 14:
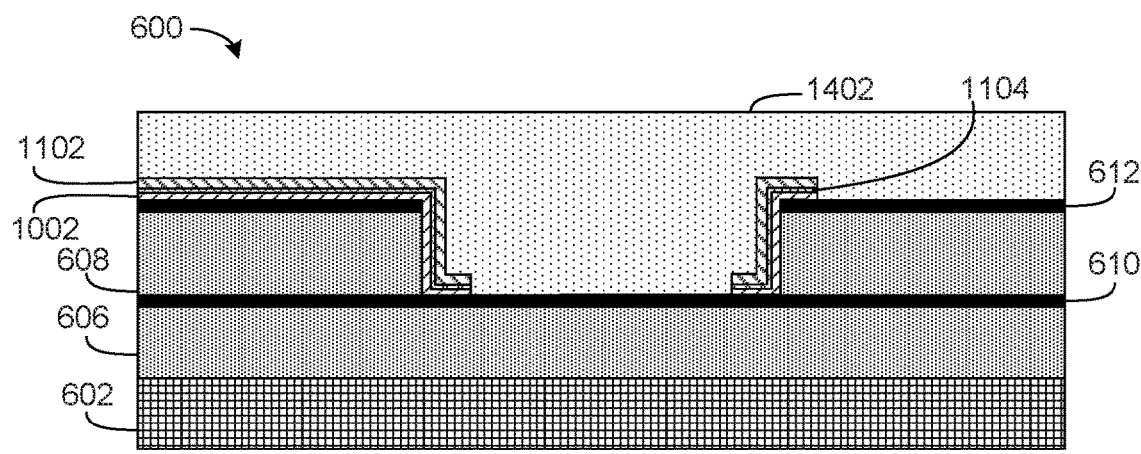

Referring to FIG. 14, to provide structural rigidity and/or enable addition of other layers to the substrate assembly 600, a spin on glass layer 1402 (e.g., hereinafter SOG layer) is coated over on the substrate assembly 600. The SOG layer 1402 may have a thickness of approximately between 1 micrometer and 1.5 micrometers. Additionally, the SOG layer 1402 of the illustrated example is substantially planar (e.g., flat) to reduce a degree of the uneven topography and reduce or eliminate a dishing effect over the sensor chamber 218. The SOG layer 1402 of the illustrated example is a sacrificial material that can easy be removed after formation of the microfluidic device 200 shown in FIG. 19. For example, the SOG layer 1402 of the illustrated example is provided to enable addition layers to be provided for formation of the fluid transport channel 208. In particular, the SOG layer 1402 is positioned in the sensor chamber 218, overlapping the conductive layer 1102 defining the electrodes 216 and the cap layer 612. The SOG layer 1402 may be formed with a material(s) that can withstand a temperature of 400° C. and that can be removed from the substrate assembly 600. In some examples, the conductive layer 1102, the passivate layer 610, the cap layer 612 and/or another surface exposed on an upper surface of the substrate assembly 600 may be coated with the SOG layer 1402. After the substrate assembly 600 is coated with the SOG layer 1402, the SOG layer 1402 is masked and patterned.

Figure 15:
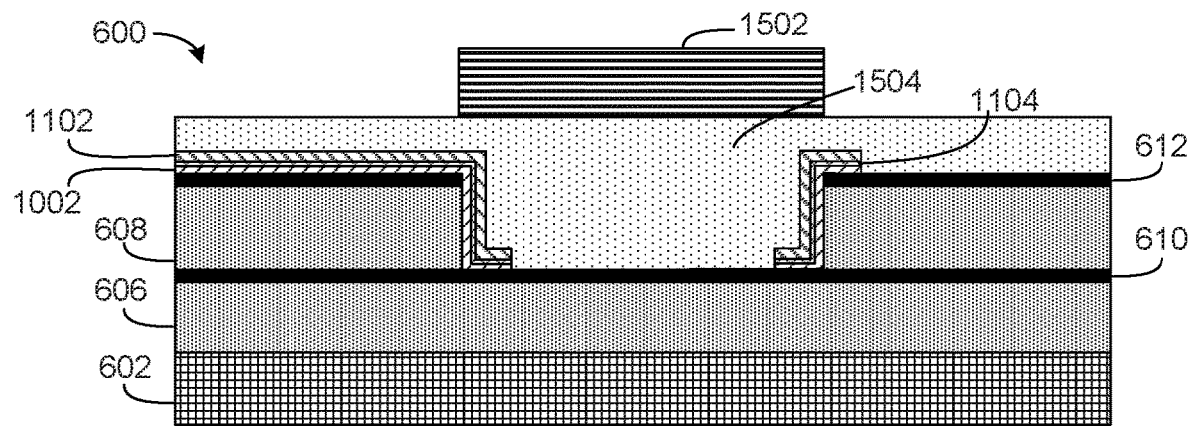

For example, referring to FIG. 15, a photoresist layer 1502 is spun on the SOG layer 1402 and is masked or patterned (e.g., via photolithography) to provide a SOG layer 1504 etched pattern. The pattern of the photoresist layer 1502 covering the SOG layer 1402 has dimensional characteristics of the sensor chamber 218. For example, the pattern of the photoresist layer 1502 is applied only over a portion of the SOG layer 1402 positioned in the sensor chamber 218. Thus, the SOG layer 1402 is etched to provide the SOG layer 1504 positioned in the sensor chamber 218. The exposed SOG layer 1402 not covered with the photoresist layer 1502 is removed via, for example, etching (e.g., wet etching, dry etching and/or a combination thereof).

Figure 16:
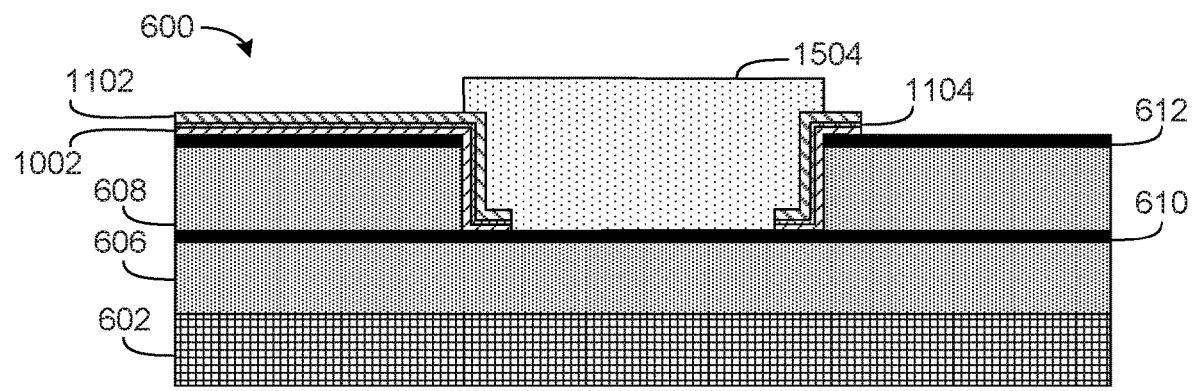

For example, FIG. 16 illustrates the exposed SOG layer 1402 removed from the substrate assembly 600, leaving the resulting SOG layer 1504. After etching, the photoresist layer 1502 used to mask or pattern the SOG layer 1504 is removed.

Figure 17:
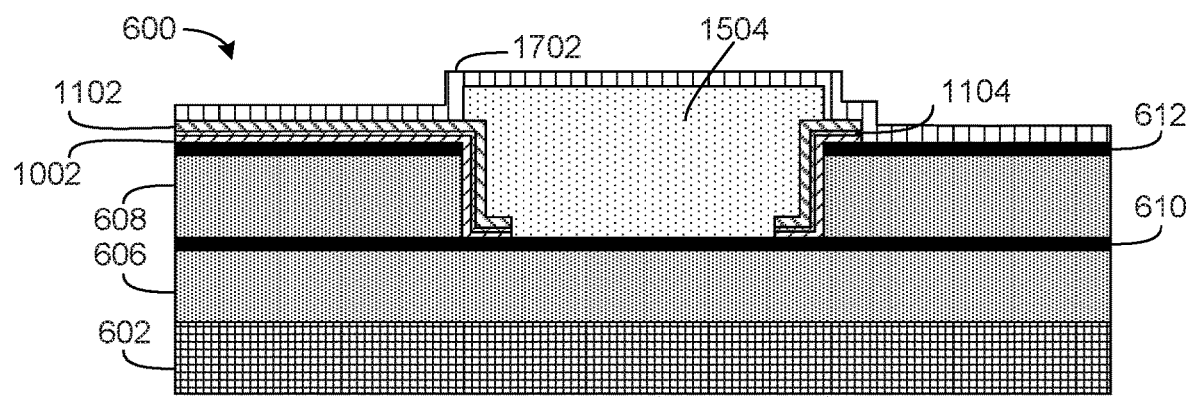

Referring to FIG. 17, to electrically seal and protect the conductive layer 1102, a die surface optimization layer 1702 (hereinafter referred to DSO layer) is deposited on the substrate assembly 600. The DSO layer 1702 is applied over the conductive layer 1102, the SOG layer 1504 and any exposed portions of the cap layer 612 and/or the second separation layer 608. The DSO layer 1702 of the illustrated example may be, for example, titanium, silicon carbide and/or any other dielectric material(s). The DSO layer 1702 of the illustrated example may have a depth of approximately between 1500 angstrom and 2500 angstrom.

Figure 18:
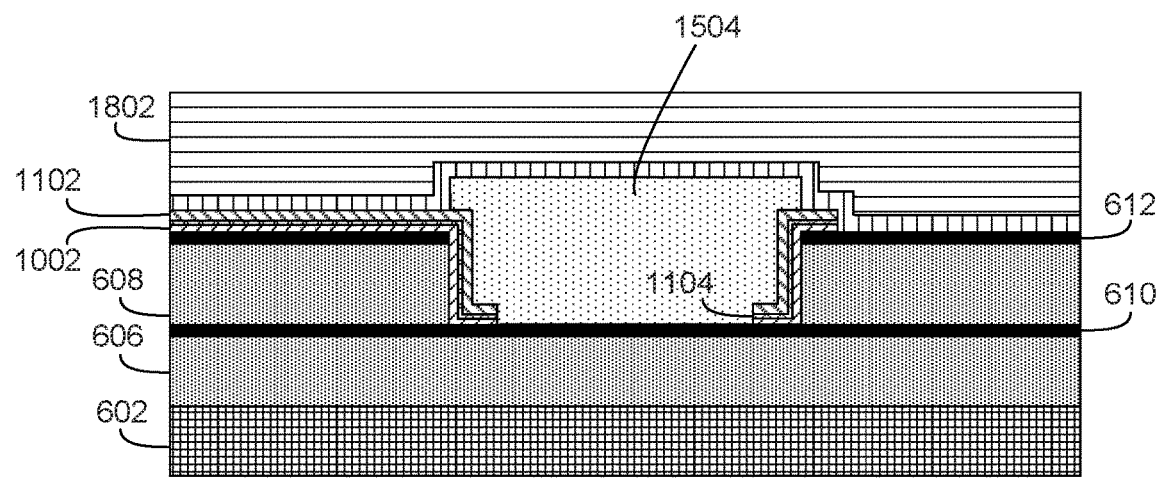

Referring to FIG. 18, to form the fluid transport channel 208, an epoxy layer 1802 is deposited on the DSO layer 1702. The epoxy layer 1802 of the illustrated example is a SU8 material(s). Portions of the epoxy layer 1802 and/or the DSO layer 1702 may be masked or patterned and etched to form, for example, the fluid outlet 206, the pump chamber 212, etc.

Figure 19:
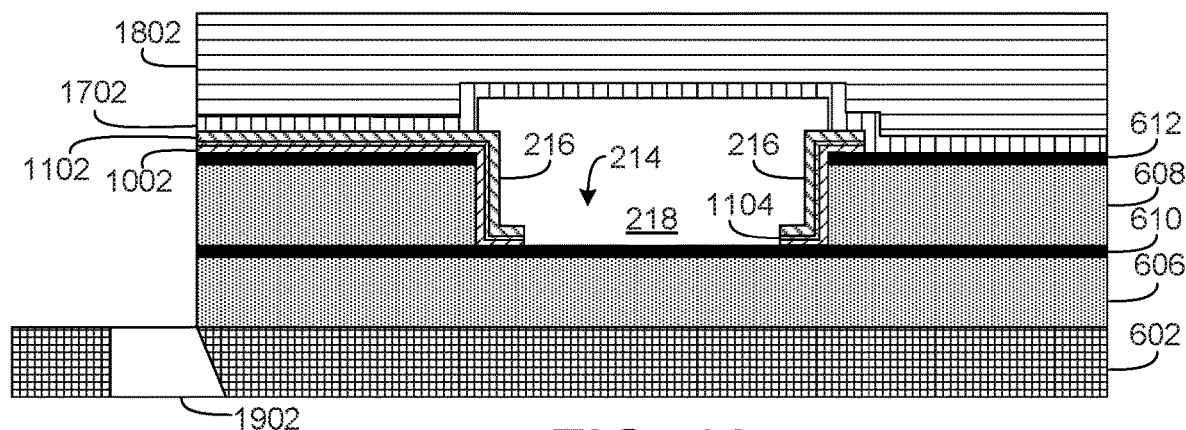

Referring to FIG. 19, the SOG layer 1504 is then removed from the sensor chamber 218. The SOG layer 1704 may be removed via, for example, wet etching. For example, the substrate assembly 600 may be immersed in acid (e.g., hydrofluoric acid, a buffered oxide etch (e.g., BOE)) to remove the SOG layer 1504 within the sensor chamber 218. The removal of the SOG layer 1504 provides the sensor chamber 218 with the electrodes 216 as shown, for example, in FIGS. 2A, 2B and 3. For example, the epoxy layer 1802 of the illustrated example is positioned (e.g., extends) over the sensor chamber 218. The epoxy layer 1802 defines the fluid transport channel 208 in fluid communication with (e.g., fluidly coupled to) the sensor chamber 218. Additionally, to provide the fluid inlet 204 in the base layer 602, a hole 1902 may be formed through the base layer 602 via, for example, drilling process(es). The formation of the pump chamber 212, the pump 210, the fluid outlet 206 and/or any other portion of the fluidic network 202 and, more generally, the microfluidic device 200 may be formed concurrently with one or more of the processes shown in FIGS. 6-19 to form, for example, the substrate assembly 236 and/or the body 222.

The example method 500 of FIG. 5 provides an alternative method of forming the example sensor apparatus 106 and/or the microfluidic device 200 of FIGS. 1, 2A-2C, and 3. Referring to FIG. 5, the method 500 begins by etching the intermediate layer 604 to form the sensor chamber 218 in the intermediate layer 604 of the substrate assembly (block 502). In some examples, the method includes obtaining the substrate assembly 600 having the base layer 602 and the intermediate layer 604. In some examples, the substrate assembly 600 may be formed using thermal inkjet manufacturing technique(s). In some examples, the intermediate layer 604 may be etched with a width of approximately between 2 micrometers and 5 micrometers. However, in some examples, the intermediate layer 604 may be etched with a width greater than 5 micrometers. The conductive layer 1102 is then deposited in the sensor chamber 218 (block 504). The electrodes 216 are etched in the sensor chamber 218 via the conductive layer 1102 (block 506). The sensor chamber 218 is coated with the SOG layer 1504 (block 508). In some examples, the DSO layer 1702 is deposited on the electrodes 216 and the SOG layer 1504. The epoxy layer 1802 is deposited on SOG layer 1504 to form the fluid transport channel 208 in fluid communication with the sensor chamber 218 (block 510). The SOG layer 1504 is then removed from the sensor chamber 218.

The example methods 400 and 500 and/or the example process of FIGS. 6-19 may be implemented with microfabrication process(es) and technique(s). For example, microfabrication, as described herein, relates to the process used for manufacture of nanometer and/or micrometer sized features on a variety of substrates using conventional microfabrication techniques. The process of microfabrication described herein may include a processes or a combination of processes such as, for example, photolithography, thermal inkjet manufacturing techniques, integrated circuit microfabrication techniques, wet etching, dry etching, anisotropic etching, spin coating, electroforming or electroplating, laser ablation, sputtering, chemical deposition, plasma deposition, surface modification, injection molding, hot embossing, thermoplastic fusion bonding, low temperature bonding using adhesives, stamping, machining, 3-D printing, laminating, and/or any other processes commonly used for manufacture of MEMS (microelectromechanical systems) or semiconductor devices. Additionally, the example fluidic channels disclosed herein may be implemented using integrated circuit thermal inkjet fabrication process(es) and/or technique(s), thereby providing a relatively small form factor and low cost apparatus.

Figure 20:
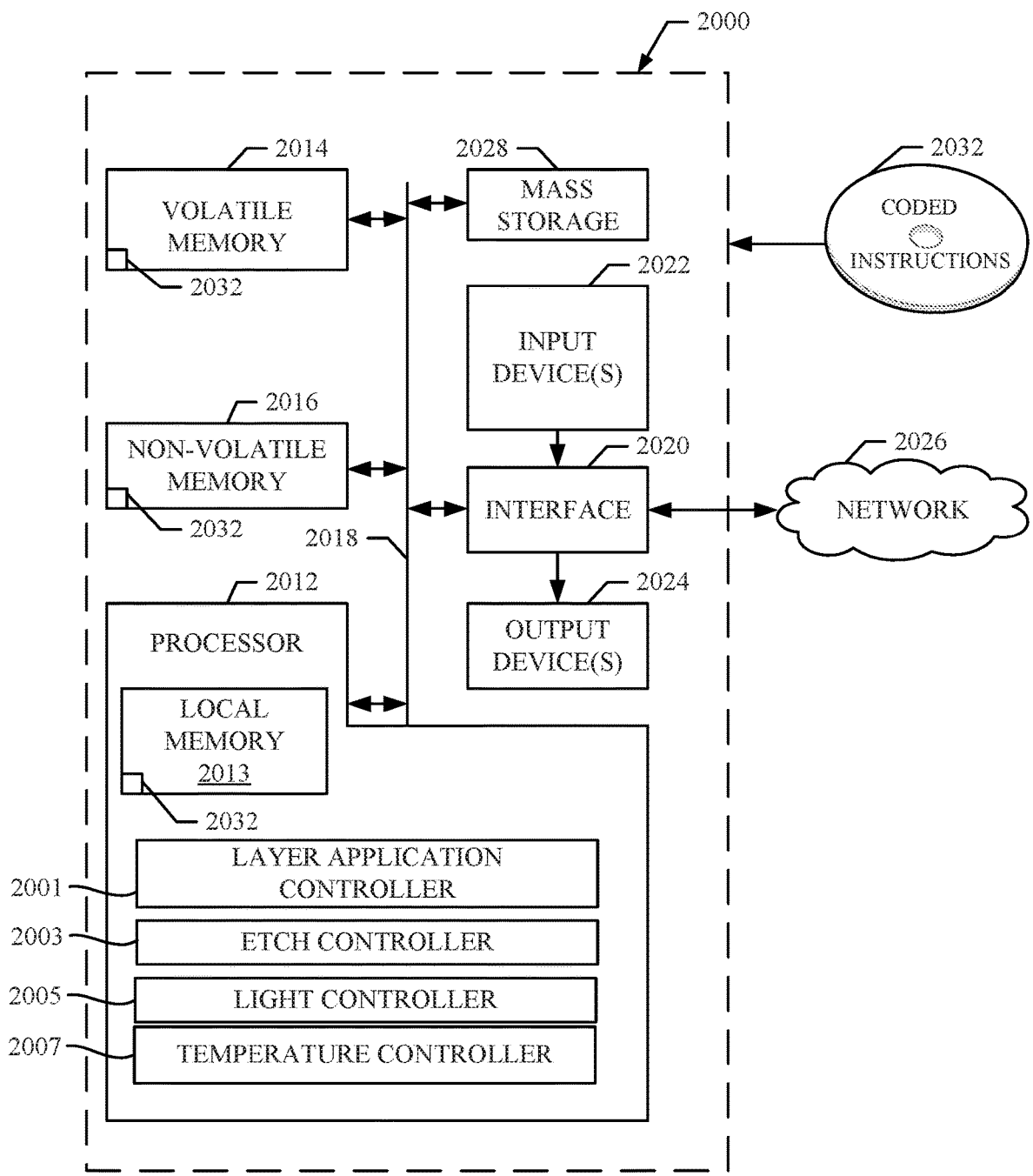
FIG. 20 is a block diagram of an example processor platform capable of executing machine-readable instructions for implementing the example methods or processes of FIGS. 4-19 to form an example microfluidic device in accordance with the teachings of this disclosure.

FIG. 20 is a block diagram of an example processor platform 2000 capable of executing instructions for controlling a machine capable of performing the above-noted microfabrication process(es) and/or technique(s) that may be used to implement the example methods 400 and 500 and/or the example process of FIGS. 6-19. The processor platform 2000 can be, for example, a server, a personal computer, a mobile device (e.g., a cell phone, a smart phone, a tablet such as an iPad™), a personal digital assistant (PDA), an Internet appliance, or any other type of computing device.

For example, the method 400, the method 500 and/or the process of FIGS. 6-19 may be implemented to control a machine via coded instructions 2032. The processor 2012 may include an example layer application controller 2001, an example etch controller 2003, an example light controller 2005, and/or an example temperature controller 2007. For example, the layer application controller 2001 may control formation of the substrate assembly 600, application of the photoresist layers 702, 1202 and 1502, the ALD layer 1002, the conductive material 1102, the bonding layer 1104, the SOG layer 1402, the DSO layer 1702, and/or the epoxy layer 1802. The etch controller 2003 may control etching of the sensor chamber 218 (e.g., FIGS. 6-9), the electrodes 216 (e.g., FIGS. 12-13), and/or the SOG layer 1504. The light controller 2005 of the illustrated example may control a light source that applies the light 704 during masking (e.g. FIGS. 7, 12 and 15). The temperature controller 2007 may control a temperature of a material during formation of the substrate assembly 600.

The processor platform 2000 of the illustrated example includes a processor 2012. The processor 2012 of the illustrated example is hardware. For example, the processor 2012 can be implemented by one or more integrated circuits, logic circuits, microprocessors or controllers from any desired family or manufacturer.

The processor 2012 of the illustrated example includes a local memory 2013 (e.g., a cache). The processor 2012 of the illustrated example is in communication with a main memory including a volatile memory 2014 and a non-volatile memory 2016 via a bus 2018. The volatile memory 2014 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 2016 may be implemented by flash memory and/or any other desired type of memory device. Access to the main memory 2014, 2016 is controlled by a memory controller.

The processor platform 2000 of the illustrated example also includes an interface circuit 2020. The interface circuit 2020 may be implemented by any type of interface standard, such as an Ethernet interface, a universal serial bus (USB), and/or a PCI express interface.

In the illustrated example, one or more input devices 2022 are connected to the interface circuit 2020. The input device(s) 2022 permit(s) a user to enter data and commands into the processor 2012. The input device(s) can be implemented by, for example, a microphone, a camera (still or video), a keyboard, a button, a mouse, a touchscreen, a track-pad, a trackball, isopoint and/or a voice recognition system.

One or more output devices 2024 are also connected to the interface circuit 2020 of the illustrated example. The output devices 2024 can be implemented, for example, by display devices (e.g., a light emitting diode (LED), an organic light emitting diode (OLED), a liquid crystal display, a cathode ray tube display (CRT), a touchscreen, a tactile output device, a printer and/or speakers). The interface circuit 2020 of the illustrated example, thus, includes a graphics driver card, a graphics driver chip or a graphics driver processor.

The interface circuit 2020 of the illustrated example also includes a communication device such as a transmitter, a receiver, a transceiver, a modem and/or network interface card to facilitate exchange of data with external machines (e.g., computing devices of any kind) via a network 2026 (e.g., an Ethernet connection, a digital subscriber line (DSL), a telephone line, coaxial cable, a cellular telephone system, etc.).

The processor platform 2000 of the illustrated example also includes one or more mass storage devices 2028 for storing software and/or data. Examples of such mass storage devices 2028 include floppy disk drives, hard drive disks, compact disk drives, Blu-ray disk drives, RAID systems, and digital versatile disk (DVD) drives.

The coded instructions 2032 may be stored in the mass storage device 2028, in the volatile memory 2014, in the non-volatile memory 2016, and/or on a removable tangible computer readable storage medium such as a CD or DVD.

From the foregoing, it will be appreciated that the above disclosed methods, apparatus and articles of manufacture increase performance of a microfluidic systems. In particular, the example microfluidic devices and/or fluidic channels disclosed herein enhance detectability of particles (e.g., cells) by controlling a dimensional characteristic or footprint of a sensor chamber. For example, a dimensional characteristic of a sensor chamber disclosed herein may be approximately 2 micrometers. The dimensional characteristics of a sensor chamber of approximately less than 5 micrometers cannot be formed from conventional manufacturing process(es) because a material such as SU8 cannot be formed with a dimensional characteristic of 2 micrometers. For example, SU8 material(s) is limited to a dimensional characteristic of no less than approximately 5 micrometers. In some instances, forming the sensor chamber with an SU8 material may cause walls of the sensor chamber to collapse during fabrication. Thus, the example methods of fabricating the example fluidic network are described in connection with FIGS. 4-19 enable the sensor chamber to be formed with the first dimensional characteristic (e.g., the dimensional width) that is approximately 2 micrometers, thereby increasing the detectability of the sensors. The example methods and apparatus described above were developed in an effort to reduce a dimensional envelope of a sensor chamber for a fluidic network with reference to a microfluidic device for biological and/or bio-chemical applications.

At least some of the aforementioned examples include at least one feature and/or benefit including, but not limited to, the following:

In some examples, a method includes etching a portion of an intermediate layer to form a sensor chamber in a substrate assembly, where the substrate assembly includes a base layer and the intermediate layer. In some such examples, the base layer comprises a first material and the intermediate layer comprises a second material different than the first material. In some such examples, the method includes forming a first electrode and a second electrode in the sensor chamber. In some such examples, the method includes forming a fluidic transport channel in fluid communication with the sensor chamber. In some such examples, the fluidic transport channel comprises of a third material different than the first material and the second material.

In some examples, the method includes providing the intermediate layer as a first separation layer adjacent a second separation layer.

In some examples, the method includes depositing a passivation layer on the first separation layer and a cap layer on the second separation layer.

In some examples, the method includes spinning a spin on glass layer on the substrate assembly.

In some examples, the method of forming the fluidic transport channel includes depositing an epoxy layer on the spin on glass layer and the substrate assembly.

In some examples, the method includes removing the spin on glass material from the sensor chamber after the epoxy layer is deposited on the spin on glass material.

In some examples, the etching the portion of the intermediate layer to form the sensor chamber includes etching a depth in the intermediate layer of approximately between 3 micrometers and 5 micrometers, and etching a width in the intermediate layer of approximately between 2 micrometers and 5 micrometers.

In some examples, the method includes forming the first electrode and the second electrode in the sensor chamber includes depositing a conductive layer on the substrate assembly and within the sensor chamber, masking or patterning the first electrode and the second electrode, and etching the conductive layer.

In some examples, a method includes etching an intermediate layer of a substrate assembly to form a sensor chamber in the intermediate layer, the substrate assembly having base layer and the intermediate layer. In some such examples, the method includes depositing a conductive layer within the sensor chamber. In some such examples, the method includes etching at least two electrodes in the sensor chamber via the conductive layer. In some such examples, the method includes coating the sensor chamber with a spin on glass layer. In some such examples, the method includes and depositing an epoxy layer over the spin on glass layer to form a fluidic transport channel in fluid communication with the sensor chamber.

In some examples, the method includes the etching of the sensor chamber in the intermediate layer includes etching the intermediate layer with a width of approximately between 2 micrometers and 5 micrometers, and a depth of approximately between 3 micrometers and 5 micrometers.

In some examples, the method includes removing the spin on glass material from the sensor chamber after the epoxy layer is deposited on the spin on glass material.

In some examples, a method for forming a sensor apparatus for a microfluidic device includes forming a substrate assembly having: a base layer composed of a first material; a first separation layer deposited on the base layer, the first separation layer formed of a second material; a passivation layer positioned on the first separation layer; a second separation layer deposited on the passivation layer; and a cap layer deposited on the second separation layer. In some such examples, the method includes etching the cap layer and the second separation layer to define a sensor chamber. In some such examples, the method includes depositing an electrically conductive layer on the cap layer and the sensor chamber. In some such examples, the method includes etching portions of the electrically conductive layer to define a first electrode and a second electrode positioned in the sensor chamber. In some such examples, the method includes coating the electrically conductive layer, the passivation layer positioned in the sensor chamber, and the cap layer with a spin on glass layer. In some such examples, the method includes etching away the spin on glass layer except for the spin on glass layer positioned in the sensor chamber. In some such examples, the method includes depositing a die surface optimization layer on the electrically conductive layer, the spin on glass layer, and the cap layer. In some such examples, the method includes depositing an epoxy layer over the die surface optimization layer. In some such examples, the method includes removing the spin on glass layer form within the sensor chamber.

In some examples, the method includes spinning a first photoresist layer on the cap layer and masking a sensor chamber pattern over cap layer prior to etching the cap layer and the second separation layer.

In some examples, the method includes depositing a bonding layer on the cap layer and the second separation layer defining the sensor chamber prior to depositing the electrically conductive layer on the cap layer and the sensor chamber.

In some examples, the method includes depositing an atomic layer deposition layer on at least one of the cap layer, the passivation layer, or walls of the second separation layer defining the sensor chamber after formation of the sensor chamber and prior to depositing the electrically conductive layer.

In some examples, the method includes spinning a second photoresist layer on the electrically conductive layer and masking a first electrode pattern and a second electrode pattern prior to etching the portions of the electrically conductive layer.

In some examples, the method includes spinning a third photoresist layer on the electrically conductive layer and masking a spin on glass sensor chamber pattern prior to etching the spin on glass.

In some examples, a microfluidic device includes a sensor chamber formed in an intermediate layer of a substrate assembly. In some such examples, the substrate assembly has a base layer and the intermediate layer, where the base is composed a first material and the intermediate layer is composed of a second material different than the first material. In some such examples, a first electrode and a second electrode are positioned in the sensor chamber. In some such examples, a fluidic transport channel in fluid communication with the sensor chamber, where the fluidic transport channel includes of a third material different than the first material and the second material.

In some examples, the intermediate layer has a first separation layer adjacent a second separation layer.

In some examples, the sensor chamber has a depth of approximately between 3 micrometers and 5 micrometers, and a width of approximately between 2 micrometers and 5 micrometers.

As noted at the beginning of this Description, the examples shown in the figures and described above illustrate but do not limit the disclosure. Other forms, details, and examples may be made and implemented. Therefore, the foregoing description should not be construed to limit the scope of the disclosure, which is defined in the following claims.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed:

1. A method comprising:
    etching a portion of an intermediate layer to form a sensor chamber in a substrate assembly, the substrate assembly having a base layer and the intermediate layer, the base layer comprising a first material and the intermediate layer comprising a second material different than the first material;
    forming a first electrode and a second electrode in the sensor chamber; and
    forming a fluidic transport channel in fluid communication with the sensor chamber, the fluidic transport channel comprising of a third material different than the first material and the second material,
    wherein forming the first electrode and the second electrode in the sensor chamber includes depositing a conductive layer on the substrate assembly and within the sensor chamber, masking or patterning the first electrode and the second electrode, and etching the conductive layer to provide three-dimensional first electrode and a three-dimensional second electrode positioned in the sensor chamber.

2. The method of claim 1, further including providing the intermediate layer as a first separation layer adjacent a second separation layer.

3. The method of claim 2, further including depositing a passivation layer on the first separation layer and a cap layer on the second separation layer.

4. The method of claim 1, further comprising applying a spin on glass layer on the substrate assembly.

5. The method of claim 4, wherein forming of the fluidic transport channel includes depositing an epoxy layer on the spin on glass layer and the substrate assembly.

6. The method of claim 5, further including removing the spin on glass layer from the sensor chamber after the epoxy layer is deposited on the spin on glass material.

7. The method of claim 1, wherein etching a portion of the intermediate layer to form the sensor chamber includes etching a depth in the intermediate layer of approximately between 3 micrometers and 5 micrometers, and etching a width in the intermediate layer of approximately between 2 micrometers and 5 micrometers.

8. A method comprising:
etching a portion of an intermediate layer to form a sensor chamber in a substrate assembly, the substrate assembly having a base layer and the intermediate layer;
depositing a conductive layer within the sensor chamber;
etching at least two electrodes in the sensor chamber via the conductive layer;
coating the sensor chamber with a spin on glass layer; and
depositing an epoxy layer over the spin on glass layer to form a fluidic transport channel in fluid communication with the sensor chamber, the fluidic channel extending from a fluid input that extends through the base layer, through the sensor chamber and to a fluid output exiting the substrate assembly; and
wherein forming a first electrode and a second electrode in the sensor chamber comprises masking or patterning the first electrode and the second electrode before etching the conductive layer to provide three-dimensional first electrode and a three-dimensional second electrode positioned in the sensor chamber.

9. The method of claim 8, wherein the etching of the sensor chamber in the intermediate layer includes etching the intermediate layer with a width of approximately between 2 micrometers and 5 micrometers, and a depth of approximately between 3 micrometers and 5 micrometers.

10. The method of claim 8, further including removing the spin on glass layer from the sensor chamber after the epoxy layer is deposited on the spin on glass layer.

11. A method for forming a sensor apparatus for a microfluidic device, the method comprising:
forming a substrate assembly having:
a base layer composed of a first material;
a first separation layer deposited on the base layer, the first separation layer formed of a second material;
a passivation layer positioned on the first separation layer;
a second separation layer deposited on the passivation layer; and
a cap layer deposited on the second separation layer;
etching the cap layer and the second separation layer to define a sensor chamber;
depositing an electrically conductive layer on the cap layer and the sensor chamber;
etching portions of the electrically conductive layer to define a first electrode and a second electrode positioned in the sensor chamber;
coating the electrically conductive layer, the passivation layer positioned in the sensor chamber, and the cap layer with a spin on glass layer;
etching away the spin on glass layer except for the spin on glass layer positioned in the sensor chamber;
depositing a die surface optimization layer on the electrically conductive layer, the spin on glass layer, and the cap layer;
depositing an epoxy layer over the die surface optimization layer; and
removing the spin on glass layer form within the sensor chamber.

12. The method of claim 11, further including spinning a first photoresist layer on the cap layer and masking a sensor chamber pattern over cap layer prior to etching the cap layer and the second separation layer.

13. The method of claim 11, further including depositing a bonding layer on the cap layer and the second separation layer defining the sensor chamber prior to depositing the electrically conductive layer on the cap layer and the sensor chamber.

14. The method of claim 11, further including depositing an atomic layer deposition layer on at least one of the cap layer, the passivation layer, or walls of the second separation layer defining the sensor chamber after formation of the sensor chamber and prior to depositing the electrically conductive layer.

15. The method of claim 3, further comprising:
etching the cap layer and the second separation layer to define the sensor chamber; and
depositing the conductive layer on the cap layer and the sensor chamber.

16. A method comprising:
etching a portion of an intermediate layer to form a sensor chamber in a substrate assembly, the substrate assembly having a base layer and the intermediate layer;
depositing a conductive layer within the sensor chamber;
etching at least two electrodes in the sensor chamber via the conductive layer;
coating the sensor chamber with a spin on glass layer;
depositing an epoxy layer over the spin on glass layer to form a fluidic transport channel in fluid communication with the sensor chamber, the fluidic channel extending from a fluid input that extends through the base layer, through the sensor chamber and to a fluid output exiting the substrate assembly;
forming the intermediate layer as a first separation layer adjacent a second separation layer;
depositing a cap layer on the second separation layer; and
etching the cap layer and the second separation layer to define the sensor chamber.

17. The method of claim 16, further comprising:
depositing the conductive layer on the cap layer and within the sensor chamber; and
etching portions of the conductive layer to define a first electrode and a second electrode positioned in the sensor chamber.

18. The method of claim 1, wherein the conductive layer comprises gold.

19. The method of claim 1, wherein the fluidic transport channel has a width less than 5 micrometers.

* * * * *